US011056448B2

(12) United States Patent
Forte et al.

(10) Patent No.: US 11,056,448 B2
(45) Date of Patent: Jul. 6, 2021

(54) COVERT GATES TO PROTECT GATE-LEVEL SEMICONDUCTORS

(71) Applicant: University of Florida Research Foundation, Incorporated, Gainesville, FL (US)

(72) Inventors: Domenic J. Forte, Gainesville, FL (US); Bicky Shakya, San Diego, CA (US); Haoting Shen, Verdi, NV (US); Mark M. Tehranipoor, Gainesville, FL (US)

(73) Assignee: University of Florida Research Foundation, Incorporated, Gainesville, FL (US)

( * ) Notice: Subject to any disclaimer, the term of this patent is extended or adjusted under 35 U.S.C. 154(b) by 0 days.

(21) Appl. No.: 16/797,695

(22) Filed: Feb. 21, 2020

(65) Prior Publication Data

US 2020/0273818 A1 Aug. 27, 2020

Related U.S. Application Data

(60) Provisional application No. 62/809,394, filed on Feb. 22, 2019.

(51) Int. Cl.
*H01L 21/00* (2006.01)
*H01L 23/00* (2006.01)
(Continued)

(52) U.S. Cl.
CPC ...... *H01L 23/573* (2013.01); *H01L 21/76831* (2013.01); *H01L 21/823807* (2013.01);
(Continued)

(58) Field of Classification Search
CPC .......... H01L 23/573; H01L 21/823871; H01L 21/823807
See application file for complete search history.

(56) References Cited

U.S. PATENT DOCUMENTS 5,646,556 A * 7/1997 Longwell ............ G06F 13/4077
326/21
6,573,775 B2 * 6/2003 Pilling ............. H03K 3/356139
327/202

(Continued)

OTHER PUBLICATIONS

Rajendran, Jeyavijayan et al. *Security Analysis of Integrated Circuit Camouflaging*, In Proceedings of the 2013 ACM SIGSAC Conference on Computer & Communications Security, Nov. 2013, pp. 709-720. DOI: 10.1145/2508859.2516656.

(Continued)

*Primary Examiner* — Laura M Menz
(74) *Attorney, Agent, or Firm* — Alston & Bird LLP

(57) ABSTRACT

Integrated circuit (IC) camouflaging has emerged as a promising solution for protecting semiconductor intellectual property (IP) against reverse engineering. The cell camouflaging covert gate leverages doping and dummy contacts to create camouflaged cells that are indistinguishable from regular standard cells under modern imaging techniques. A comprehensive security analysis of the covert gate shows that it achieves high resiliency against SAT and test-based attacks at very low overheads. Models are derived to characterize the covert cells, and metrics are developed to incorporate them into a gate-level design. Simulation results of overheads and attacks are presented on benchmark circuits.

10 Claims, 26 Drawing Sheets

(51) Int. Cl.
*H01L 21/8238* (2006.01)
*H01L 23/522* (2006.01)
*H01L 21/768* (2006.01)
*H01L 27/092* (2006.01)

(52) U.S. Cl.
CPC .. *H01L 21/823871* (2013.01); *H01L 23/5226* (2013.01); *H01L 27/092* (2013.01)

(56) References Cited

U.S. PATENT DOCUMENTS

| | | | | |
|---|---|---|---|---|
| 6,700,425 | B1* | 3/2004 | Pilling | H03K 3/356139 |
| | | | | 327/291 |
| 7,376,027 | B1* | 5/2008 | Chung | G11C 11/4076 |
| | | | | 365/189.08 |
| 10,671,700 | B2* | 6/2020 | Irissou | G06F 30/33 |
| 2003/0080793 | A1* | 5/2003 | Pilling | H03K 3/356139 |
| | | | | 327/202 |
| 2005/0035369 | A1* | 2/2005 | Lin | H01L 29/6653 |
| | | | | 257/194 |
| 2012/0200313 | A1* | 8/2012 | Kyue | H03K 19/0019 |
| | | | | 326/8 |
| 2013/0107651 | A1* | 5/2013 | Singh | G11C 11/419 |
| | | | | 365/207 |
| 2013/0208554 | A1* | 8/2013 | Wang | G11C 7/18 |
| | | | | 365/194 |
| 2014/0103344 | A1* | 4/2014 | Tehranipoor | G01R 31/31725 |
| | | | | 257/48 |
| 2015/0213857 | A1* | 7/2015 | Wang | G11C 7/22 |
| | | | | 365/189.11 |
| 2016/0105181 | A1* | 4/2016 | Kerr | H03K 19/0002 |
| | | | | 326/59 |
| 2018/0301185 | A1* | 10/2018 | Lin | G11C 11/419 |
| 2019/0311156 | A1* | 10/2019 | Tehranipoor | G06F 30/39 |
| 2020/0273818 | A1* | 8/2020 | Forte | H01L 23/5226 |
| 2020/0411453 | A1* | 12/2020 | Lu | H01L 21/823871 |
| 2021/0004459 | A1* | 1/2021 | Mishra | G06F 21/554 |

OTHER PUBLICATIONS

Akkaya, Nail Etkin Can et al. *A Secure Camouflaged Logic Family Using Post-Manufacturing Programming With a 3.6GHz Adder Prototype in 65nm CMOS at 1v Nominal $V_{DD}$*, 2018 IEEE International Solid-State Circuits Conference—(ISSCC), pp. 128-130. DOI:10.1109/ISSCC.2018.8310217.

Malik, Shweta et al. *Development of a Layout-Level Hardware Obfuscation Tool*. In 2015 IEEE Computer Society Annual Symposium on VLSI, Jul. 8, 2015, pp. 204-209. IEEE.

* cited by examiner

Figures 5(a), 5(b), and 5(c)

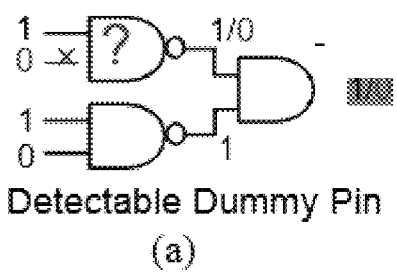
Detectable Dummy Pin
(a)
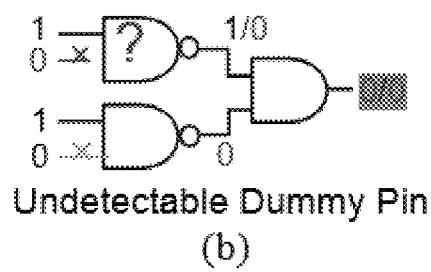
Undetectable Dummy Pin
(b)
× Pin(s) to Query
× Interfering Pin
? Current suspect gate
? Interfering gate
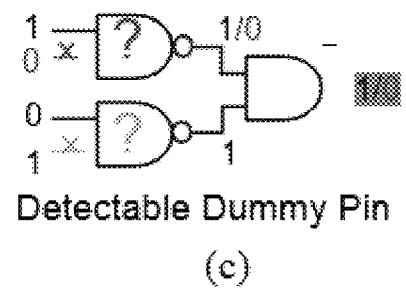
Detectable Dummy Pin
(c)
Figures 17(a), 17(b), and 17(c)

COVERT GATES TO PROTECT GATE-LEVEL SEMICONDUCTORS

CROSS REFERENCE TO RELATED APPLICATIONS

This application claims the benefit of U.S. Provisional Patent Applications No. 62/809,394, titled "Covert Gates Based on a Combination of Doping and Dummy Contracts for Protecting Gate-Level Semiconductor Intellectual Property," filed Feb. 22, 2019, which is incorporated by reference herein in its entirety.

GOVERNMENT FUNDING

This invention was made with government support under grant number FA9550-14-1-0351 awarded by the U.S. Air Force Office of Scientific Research. The government has certain rights in the invention.

BACKGROUND

Reverse engineering of integrated circuits (ICs) is a common practice in the semiconductor industry. It is routinely used for (i) failure analysis, defect identification, and fault diagnosis, detection of counterfeit ICs and (iii) analysis of competitor IP (e.g., technology node or process analysis, and checking whether patents were infringed). While reverse engineering for such purposes is a legal and acceptable practice, it can also be done with malicious intent. For example, a reverse engineer may obtain the complete gate-level netlist of the circuit through reverse engineering of an IC's physical layout. By doing so, the reverse engineer could infringe on the owner's intellectual property (IP), by incorporating the extracted IP core into his or her own design or by selling it to third parties. The illicitly obtained IP could also be used to create cloned ICs and electronic systems. Further, an untrusted semiconductor foundry could also use reverse engineering to fully understand the functionality of a design and insert a targeted, stealthy hardware Trojan.

Traditional IC reverse engineering involves four distinct phases, namely:
1. Decapsulation involves removing the IC packaging using corrosive chemicals and/or abrasion (e.g., by polishing the package surface).
2. Delayering is the layer-by-layer removal of the metal interconnects between logic gates, polysilicon traces as well as the transistor layers. The insulating layer between different metal layers is also removed. Dry or wet etching (i.e., removing specific materials via chemical reactions) is employed for this purpose.
3. Imaging is used to capture the IC layout at each layer after delayering. Scanning electron microscopy (SEM) is used for this purpose to capture high resolution images of micro/nano-scale features.
4. Post-processing includes stitching of imaged layers after image processing, identifying primitives (e.g., logic gates) and obtaining a gate-level netlist, with associated connections between them.

IC camouflaging techniques focus on disrupting the ability of the attacker to identify logic gates from the images obtained after delayering and imaging. For instance, this may be achieved by creating special standard cells with "dummy contacts." Based on the configuration of the contacts, a cell can implement one of many Boolean functions (e.g., AND, OR, NAND, NOR, XOR). When an attacker delayers and images the IC, he/she would be unable to resolve the contacts and reveal the identity of the camouflaged gates. As a result, some of the gates in the netlist obtained through the reverse engineering process become ambiguous, as shown in FIG. 1b. However, it has been shown that camouflaging can be vulnerable to attacks adapted from VLSI testing and Boolean satisfiability. For successfully performing these attacks, the adversary generates a set of input patterns and observes the outputs to decide the identity of the camouflaged gates. Test-based attacks generate these patterns by modeling the gate behavior with manufacturing faults and using common automatic test pattern generation (ATPG) techniques. On the other hand, satisfiability (SAT)-based attacks attempt to find proper logical assignments to the camouflaged gates by using various SAT formulations. It has been shown that creating secure designs with camouflaged gates that are resilient to these attacks incurs significant overhead in terms of area and performance.

A different approach is taken to IC camouflaging in this disclosure. In contrast to using readily identifiable camouflaged gates, regular logic gates are modified to introduce 'dummy input(s)". When a reverse engineer tries to recover the netlist, the gate is identified as any regular cell (e.g., AND, OR, XOR). Hence, it is coined as a "covert gate". However, an extra pin (or pins) is introduced into the gate, due to which the recovered netlist becomes erroneous. A comparison between previous camouflaging and the technique is shown in FIG. 2. As seen in FIG. 2(a), all previous camouflaging approaches configure a logic gate into any one of N possibilities (e.g., NAND, NOR or XOR). However, these cells are easily identifiable in the design, consume large area/power/delay overheads and are susceptible to attacks. In case of covert gates, a regular gate with N inputs is transformed to the same gate with N+i inputs, where i is the number of dummy inputs used, as shown in FIG. 2(b). In Boolean logic, logical NOR is a truth-functional operator which produces the negation of logical or result. For example, a 2-input NOR gate is transformed into a 3-input NOR gate. Similarly, an inverter with one input is transformed to a NOR gate with 2 inputs, where one of the inputs is a dummy. These gates still function as intended (i.e., a camouflaged 2-input NOR gate still behaves as an inverter). However, this is not obvious to the attacker, as one (or more) of the inputs is configured as dummy and the camouflaged gates look no different from regular gates. Compared to prior camouflaging approaches, the covert gates offer the following benefits:

Inexpensive: A covert gate can be implemented by a minor change in the IC fabrication process, with only three additional masks required.

Low overhead: The covert gate incurs minimal overhead compared to previously proposed camouflaged gates, which need to be configured for various Boolean functions in one single cell. This contributes to their high layout area and poor leakage power/delay performance. In contrast, covert gates with dummy inputs consume no more area than regular standard cells and have much lower delay/power overheads. For example, the delay and power characteristics of an inverter that has been converted to a 2-input covert NAND/NOR gate are similar to that of a regular 2-input NAND/NOR gate, with area increasing by less than 1.67×. In contrast, the area, delay and power overheads of a dummy contact based camouflaged NAND gate are 5.5×, 1.6× and 4× respectively.

Indistinguishable from standard cells under SEM: From an attacker's perspective, all gates with more than one input are considered as suspect in the entire design, as the covert gates "blend in" with other gates in the netlist. Therefore, any invasive or non-invasive attack has to consider all gates in the design, which greatly increases attack complexity without the need for additional countermeasures.

Tunable output corruptibility: There is also the opportunity to choose nets in the design to connect to the dummy inputs, such that the functional/logical difference between the netlist recovered by the attacker and the original design is further increased.

Other efforts include the work by 1) J. Rajendran, et al., 2) N. E. C. Akkaya, et al., 3) S. Malik, et al., which are illustrated in Figures (a)-(c).

BRIEF SUMMARY

In general, embodiments of the present invention provide methods, apparatuses, systems, computing devices, computing entities, and/or the like.

In accordance with one aspect, a covert gate is disclosed based on doping modification and dummy contact.

In one embodiment of the disclosure, a covert device includes a NOR circuit. The NOR circuit comprises: a regular PMOS transistor and an always-on PMOS transistor connected in series to form a PULL-UP network (PUN); and a regular NMOS transistor and an always-off NMOS transistor connected in parallel to form a pull-down network (PDN); wherein the PUN and PDN networks are connected in series; wherein the always-on PMOS transistor comprises: an active region comprising first dopants at a first carrier concentration under a gate of the always-on PMOS transistor; a source and a drain comprising second dopants; and a layer of third dopants at a third carrier concentration arranged inside the active region, wherein the third carrier concentration of the third dopants is higher than the first carrier concentration of the first dopants, such that the always-on PMOS transistor remains in an always-on state; and wherein the always-off NMOS transistor comprises: an active region comprising the second dopants at a second carrier concentration under a gate of the always-off NMOS transistor; a source and a drain comprising the first dopants; a contact hole formed directly on a top of the gate and the source of the always-off NMOS transistor; and a layer of dielectric material coated on a side wall and a bottom of the contact hole to insulate said gate from a conductive material filled into the contact hole, such that the always-off NMOS transistor remains in an always-off state.

Optionally, the third dopants are injected into the active region of the always-on PMOS transistor with ion implantation.

Optionally, the layer of dielectric material is silicon oxide or nitride.

In another embodiment of the disclosure, a method of fabricating the NOR circuit includes fabricating the always-on PMOS transistor by steps comprising: forming the active region comprising the first dopants at the first carrier concentration under the gate of the always-on PMOS transistor; forming the source and the drain comprising the second dopants; and depositing the third dopants inside the active region of the always-on PMOS transistor, wherein the third dopants are deposited at a higher carrier concentration than the first carrier concentration of the first dopants, such that the always-on PMOS transistor remains in an always-on state, and wherein the first dopant and the third dopants have a same polarity.

In another embodiment of the disclosure, a method of fabricating the NOR circuit includes fabricating the always-off NMOS transistor by steps comprising: forming the active region comprising the second dopants under the gate of the always-off NMOS transistor; forming the source and the drain comprising the first dopants; forming the contact hole directly on a top of said gate; and depositing a layer of dielectric material on the side wall and the bottom of the contact hole to insulate said gate from the conductive material filled into the contact hole, such that the always-off NMOS transistor remains in an always-off state.

In another embodiment of the disclosure, a covert device includes a NAND circuit. The NAND circuit comprises: a regular PMOS transistor and an always-off PMOS transistor connected in parallel to form a PULL-UP network (PUN); and a regular NMOS transistor and an always-on NMOS transistor connected in series to form a pull-down network (PDN). The PUN and PDN networks are connected in series; wherein the always-off PMOS transistor comprises: an active region comprising the first dopants under a gate of the always-off PMOS transistor; a source and a drain comprising a second dopants; a contact hole formed directly on a top of the gate of the always-off PMOS transistor; and a layer of dielectric material coated on a side wall and a bottom of the contact hole to insulate said gate from a conductive material filled into the contact hole, such that the always-off PMOS transistor remains in an always-off state; and wherein the always-on NMOS transistor comprises: an active region comprising the second dopants at a second carrier concentration under a gate of the always-on NMOS transistor; a source and a drain comprising the first dopants; and a layer of third dopants at a third carrier concentration arranged inside the active region, wherein the third carrier concentration of the third dopants is higher than the second carrier concentration of the second dopants, such that the always-on NMOS transistor remains in an always-on state.

Preferably, the first dopants in the active region are N-type of carriers like electrons in NMOS and the first dopants in the active region are P-type of carriers like holes in P-MOS.

Preferably, the third dopants are injected into the active region with ion implantation.

BRIEF DESCRIPTION OF THE SEVERAL VIEWS OF THE DRAWINGS

Figure 1A:
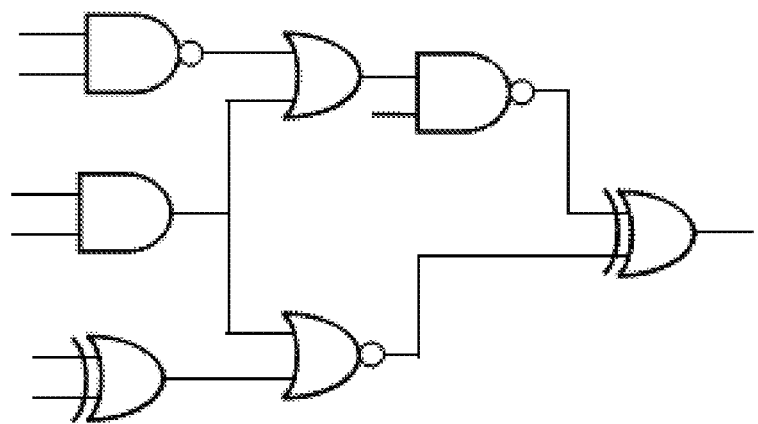
Figure 1B:
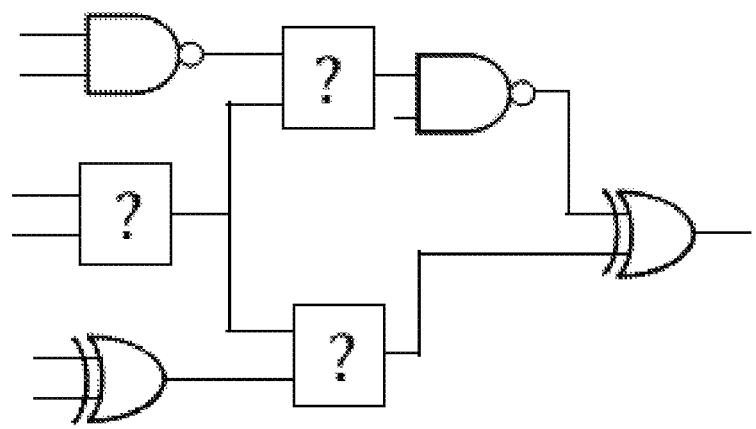
Figure 2A:
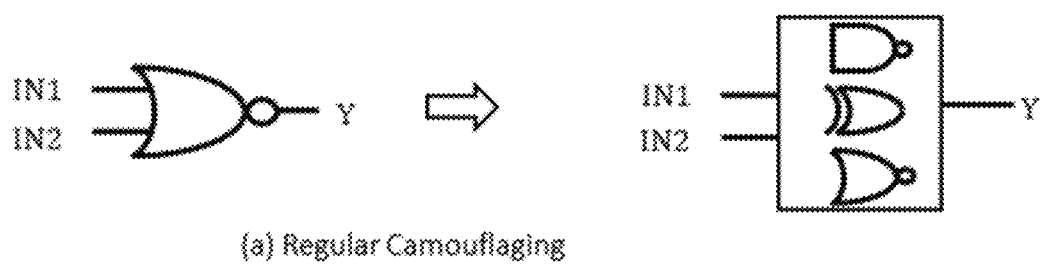
Figure 2B:
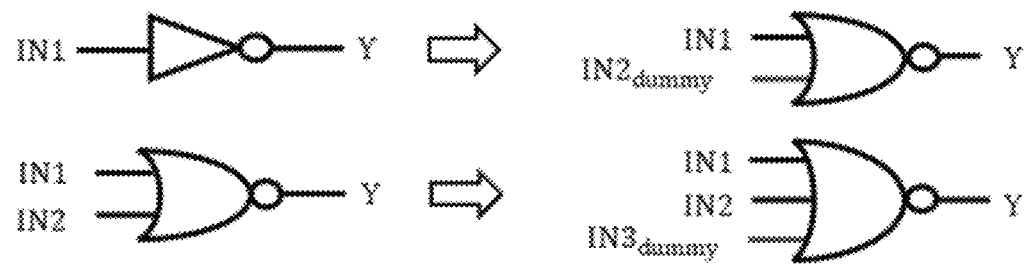
Figure 3:
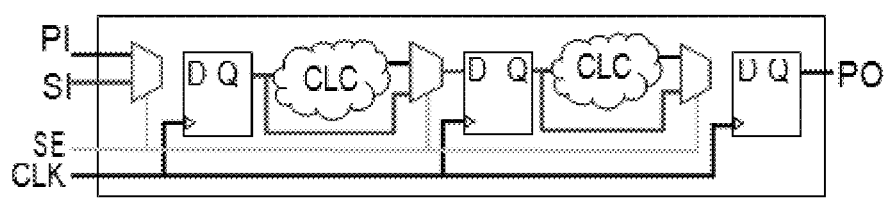
Figure 4:
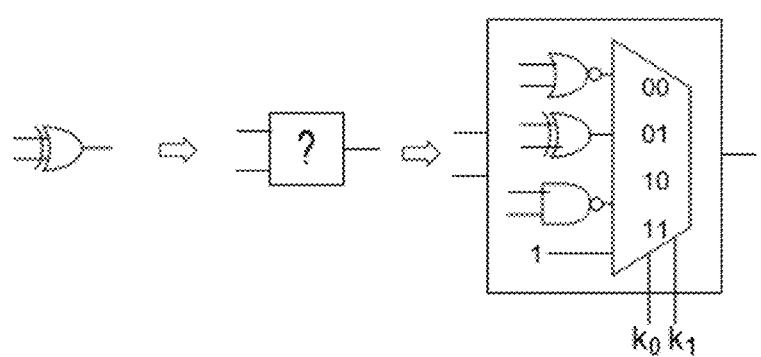
Figure 5:
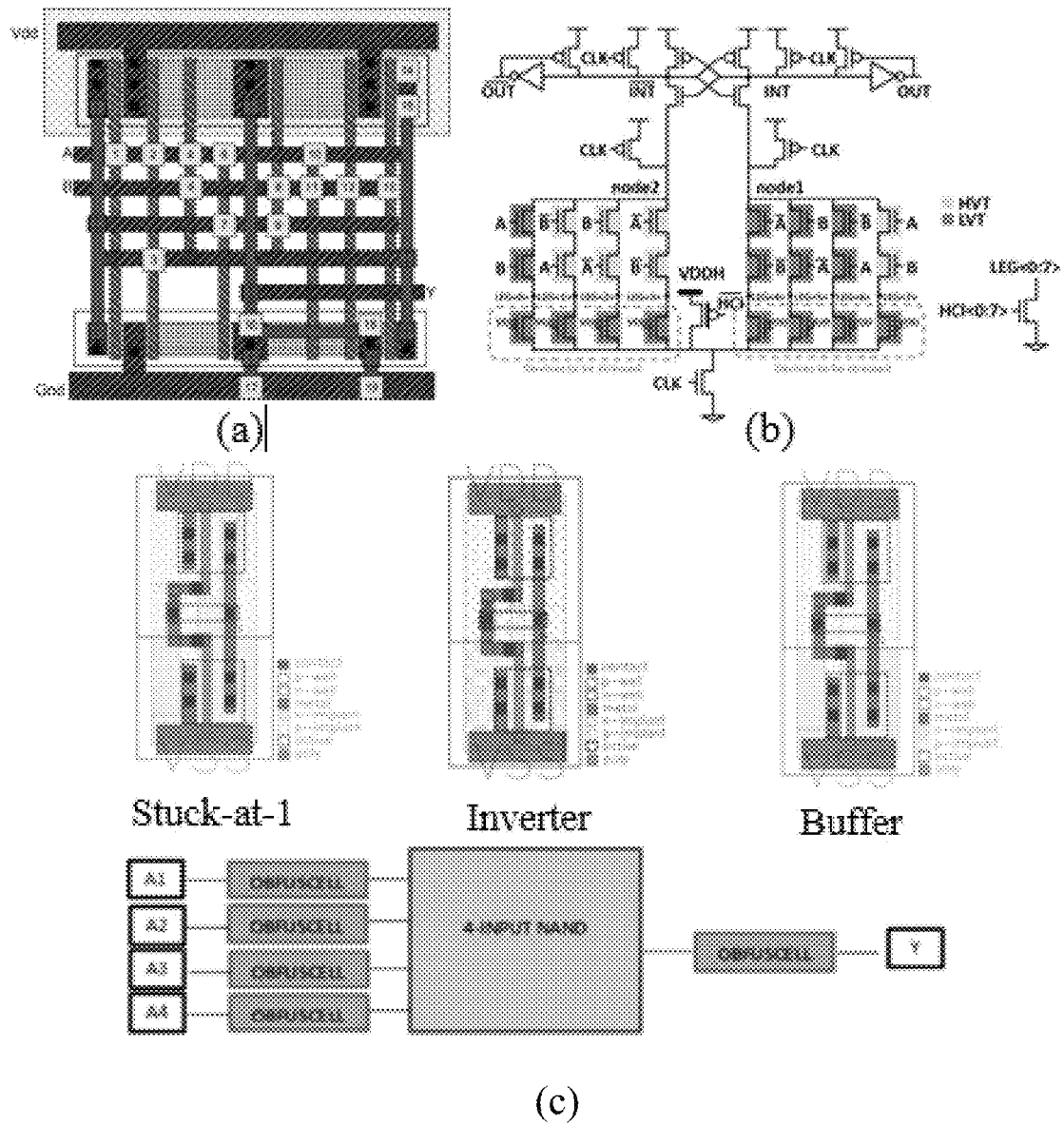
Figure 6:
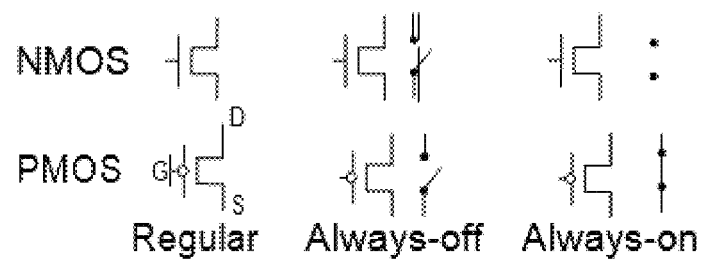
Figure 7:
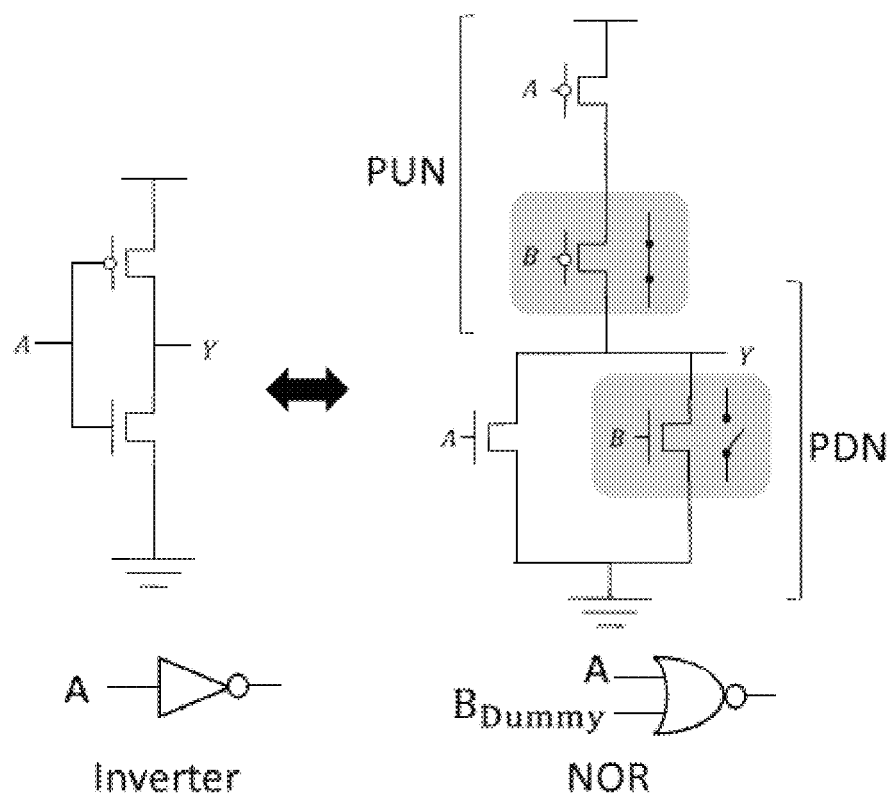
Figure 8:
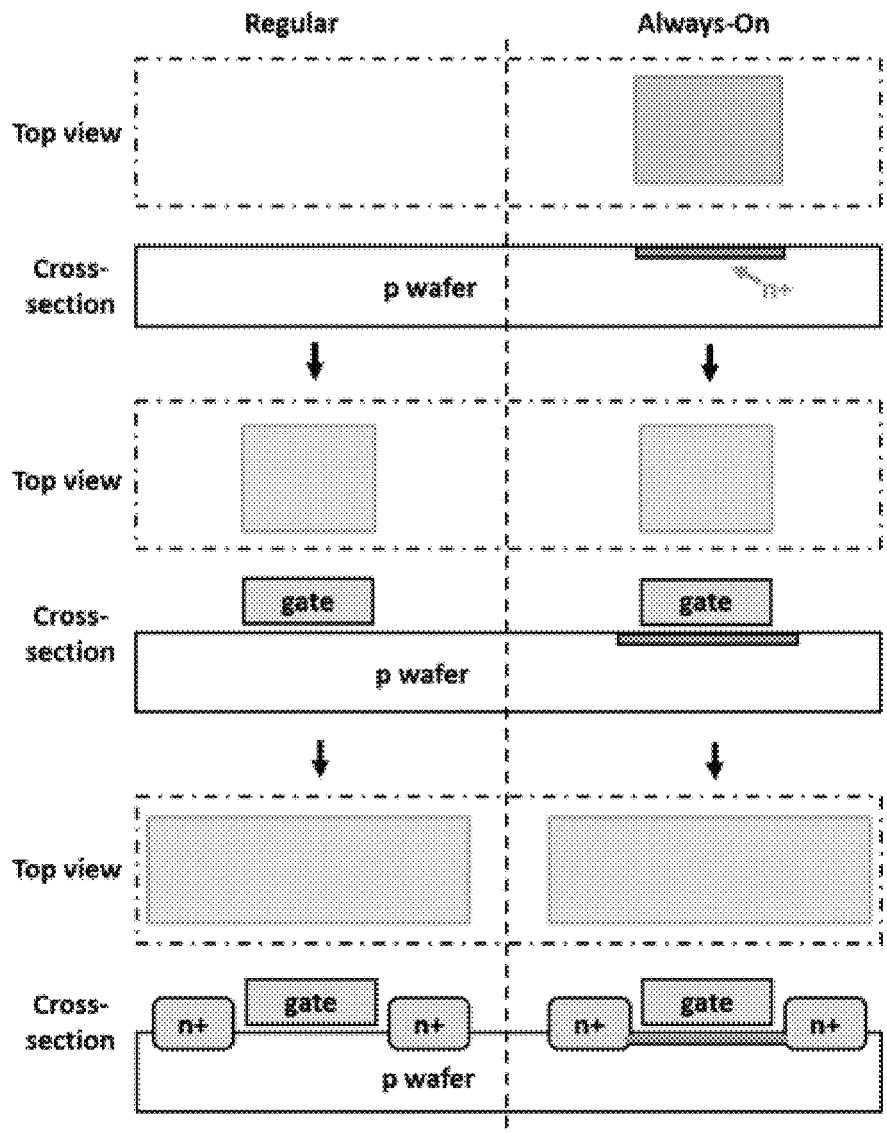
Figure 9A:
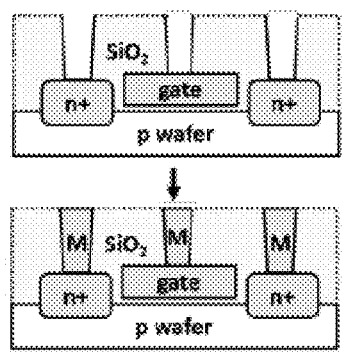
Figure 9B:
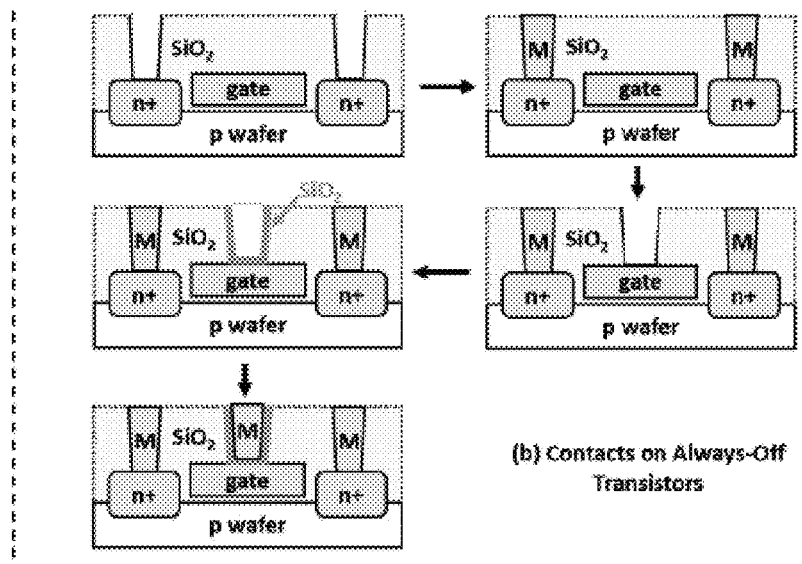
Figure 11:
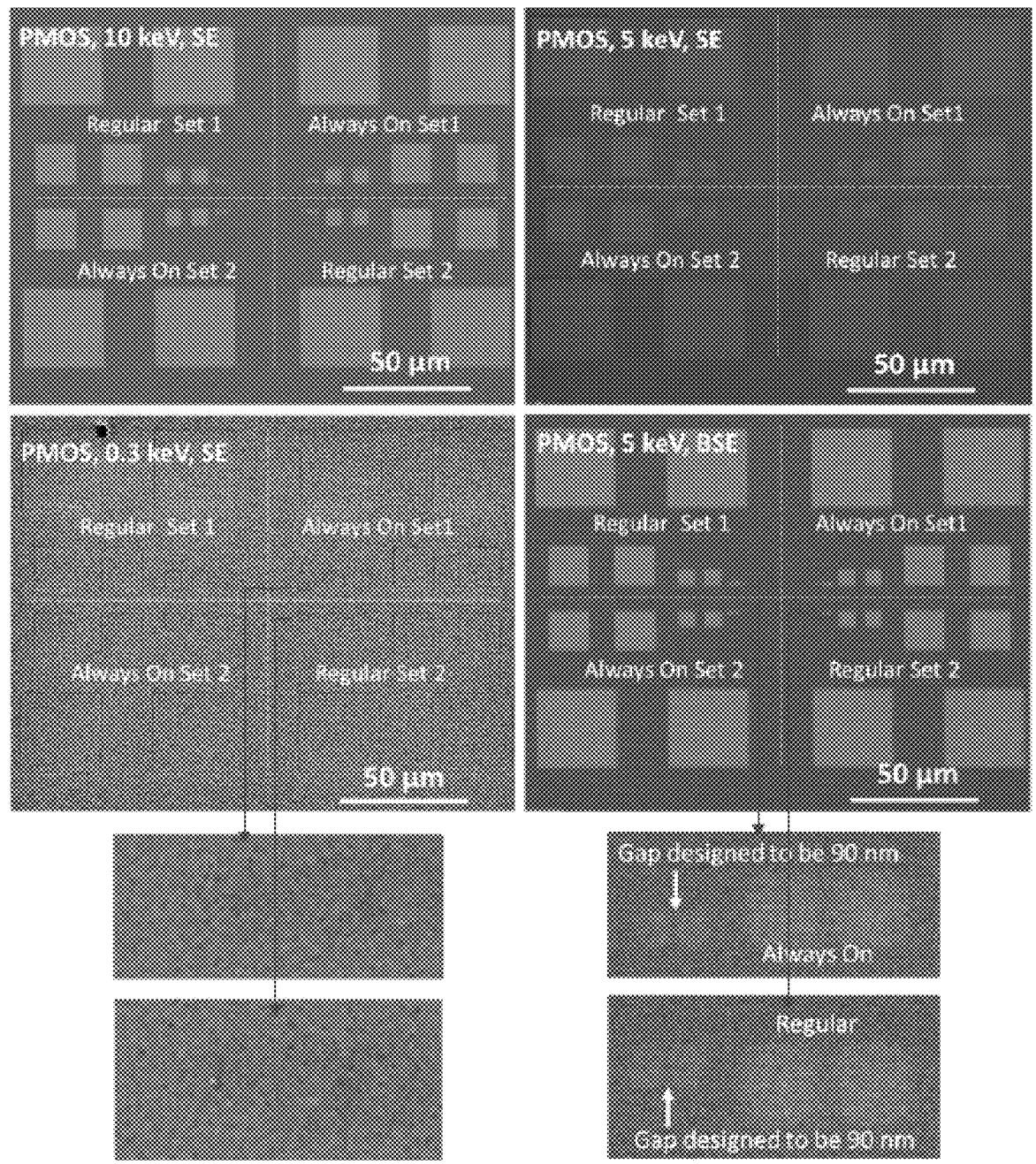

Having thus described the invention in general terms, reference will now be made to the accompanying drawings, which are not necessarily drawn to scale, and wherein:

FIG. 1(a) is a diagram of an original gate-level netlist and FIG. 1(b) is a netlist containing camouflaged cells obtained after reverse engineering;

FIG. 2(a) is a schematic of regular camouflaged gate configurable based on dummy contacts, threshold voltage, or dopant polarity;

FIG. 2(b) is the schematic of the camouflaging scheme with dummy inputs, in accordance with certain embodiments of the present invention;

FIG. 3 is a schematic of a scan chain-inserted design, in accordance with certain embodiments of the present invention;

FIG. 4 is a schematic of a SAT formulation for resolving camouflaged gates, in accordance with certain embodiments of the present invention;

FIG. 5(a) is a schematic representation of a dummy contact-based camouflaged gate that can be configured as NAND, NOR or XOR;

FIG. 5(b) shows a post-manufacturing programmed threshold voltage defined gatSomee;

FIG. 5(c) is a schematic flow chart of the camouflaged gate based on dopant polarity;

FIG. 6 shows examples of NMOS/PMOS transistors and always-on/always-off transistors (where S→Source, G→Gate, D→Drain);

FIG. 7 shows a schematic of a 2-input NOR gate, in accordance with certain embodiments of the present invention;

FIG. 8 is a schematic for an exemplary fabrication process, in accordance with certain embodiments of the present invention;

FIG. 9(a) shows a schematic for a fabrication process of contacts on a regular transistor and FIG. 9(b) shows for an "always-off" transistor, in accordance with certain embodiments of the present invention;

FIGS. 10(a)-(d) show that the effective conduction volumes variation, in accordance with certain embodiments of the present invention;

FIG. 11 shows the doped regions of PMOS transistors for regular and "always on" cases.

Figure 12:
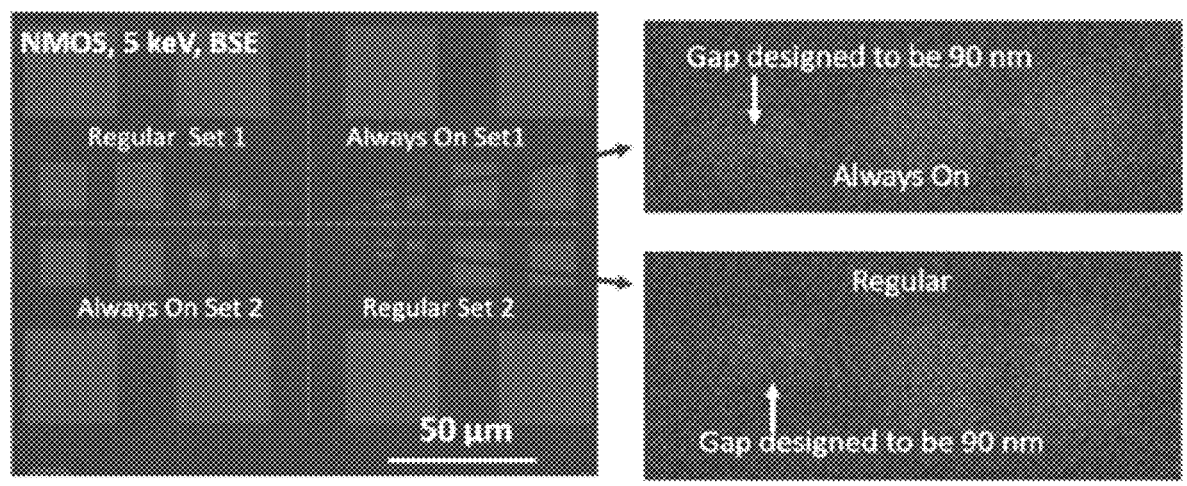

FIG. 12 illustrates the doped regions of NMOS transistors for regular and "always on" cases.

Figures 13A, 13B:
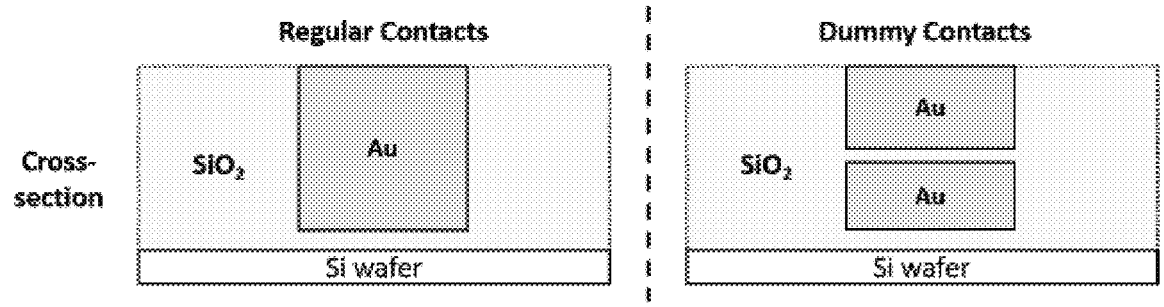
Figure 13C:
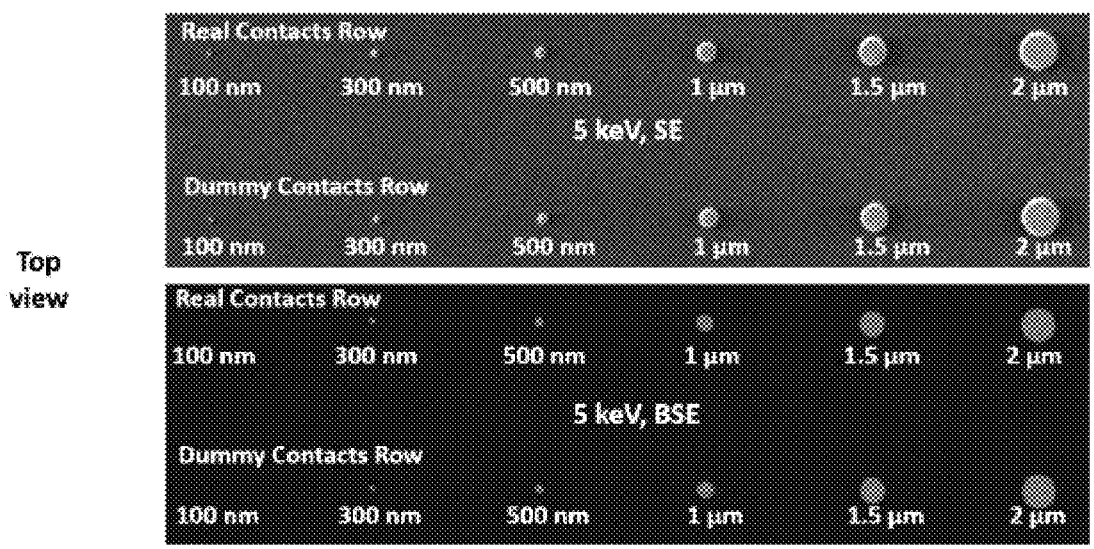

FIGS. 13(a), 13(b) and 13(c) show schematic cross-sectional views and top view of contacts in 13(a) and dummy contacts in (b) for regular and "always-off" transistors under SE and BSE imaging conditions.

Figure 14:
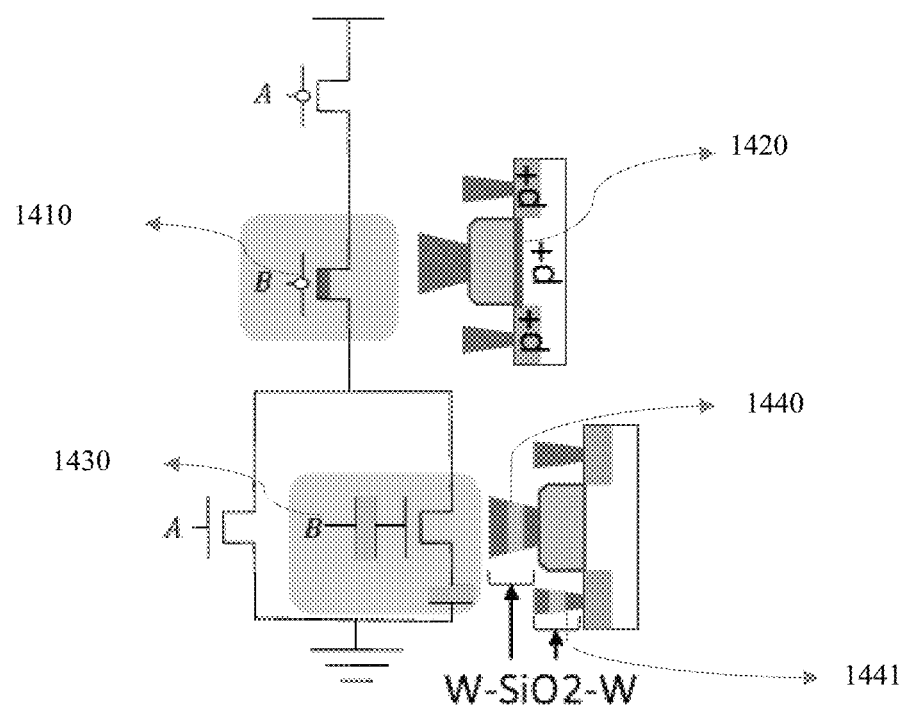

FIG. 14 illustrates the modeling result of the always-on transistor and always-off transistor.

Figure 15:
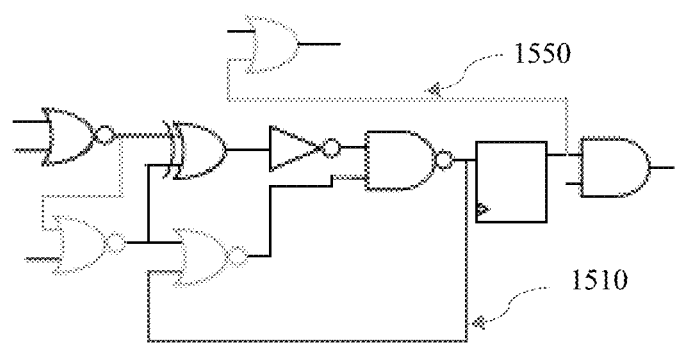

FIG. 15 is a schematic diagram of valid nets and invalid nets for the dummy inputs of the covert gates.

Figures 16A, 16B:
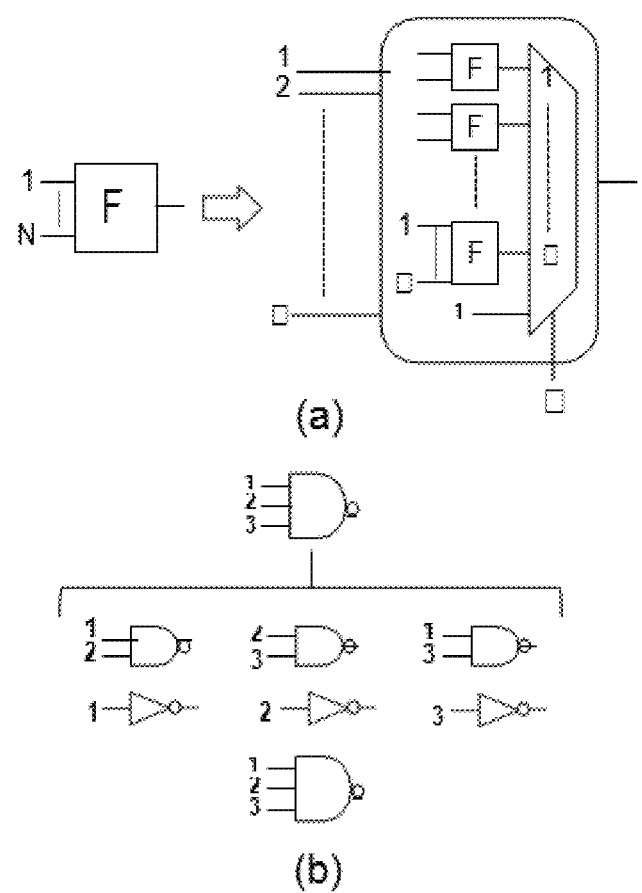

FIG. 16(a) is a schematic of transforming a camouflaged gate with an unknown number of dummy inputs into a pin permutation network to be solved by SAT. FIG. 16(b) shows a 3-input NAND gate and its 7 possible candidates.

FIG. 17(a) shows a detectable dummy pin which can be sensitized and propagated to output. FIG. 17(b) shows an undetectable dummy pin whose output is contaminated by another dummy pin. FIG. 17(c) shows a detecting dummy pin in the presence of an interfering dummy pin.

Figure 18:
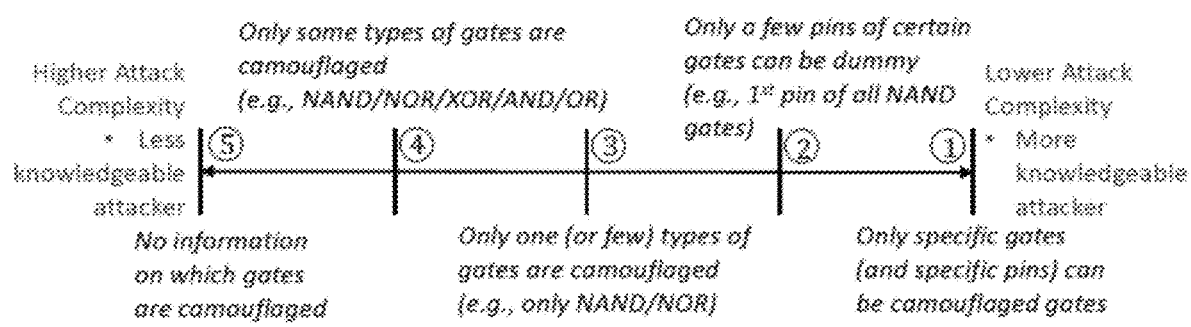

FIG. 18 shows a flow diagram of a varying range of available information to the reverse engineer during the de-camouflaging process.

Figure 19:
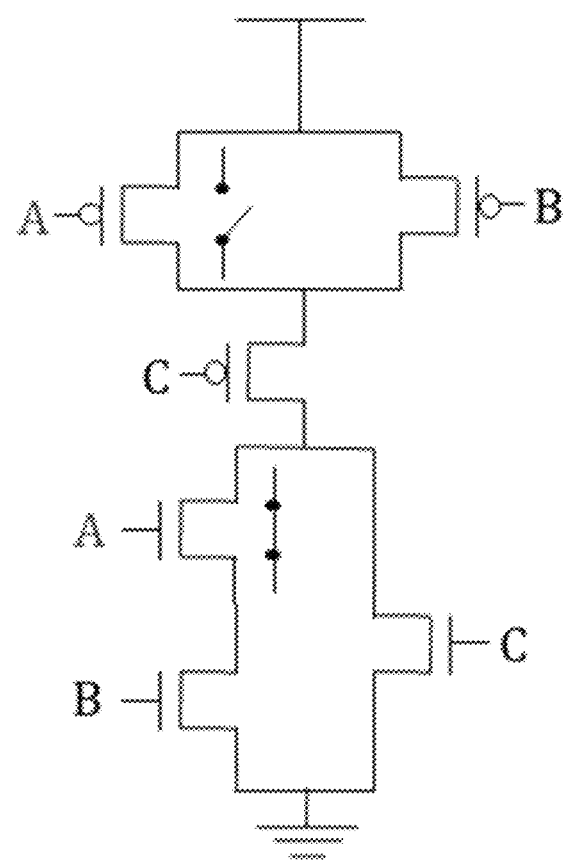

FIG. 19 shows a covert And-Or-Invert (AOI) gate.

Figure 20:
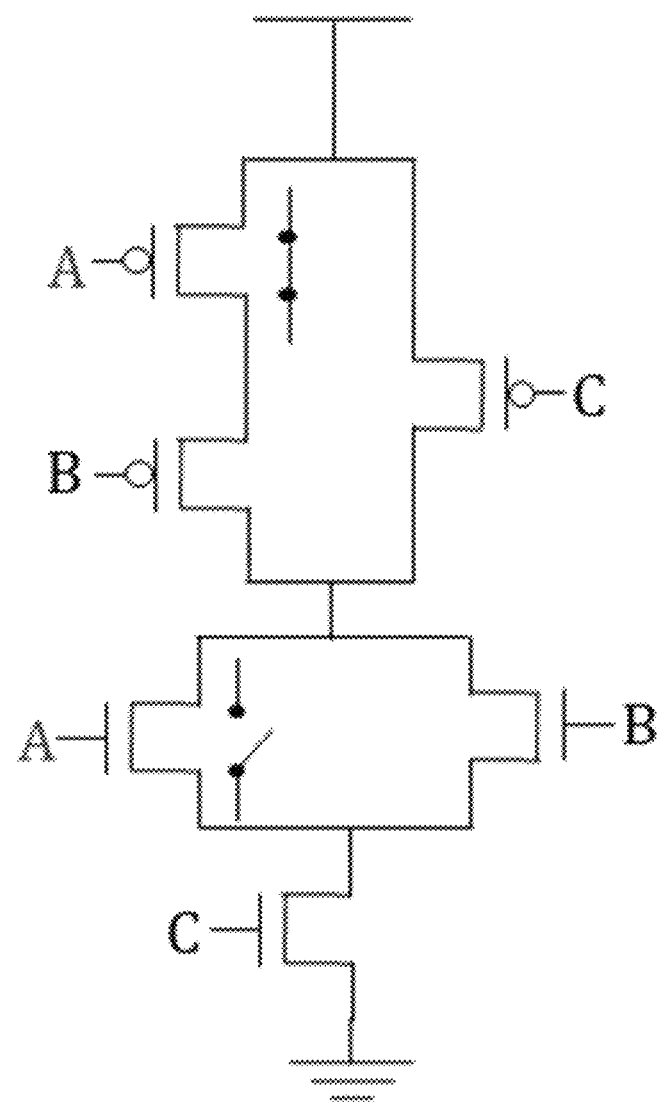

FIG. 20 shows a covert Or-And-Invert (OAI) gate.

Figure 21:
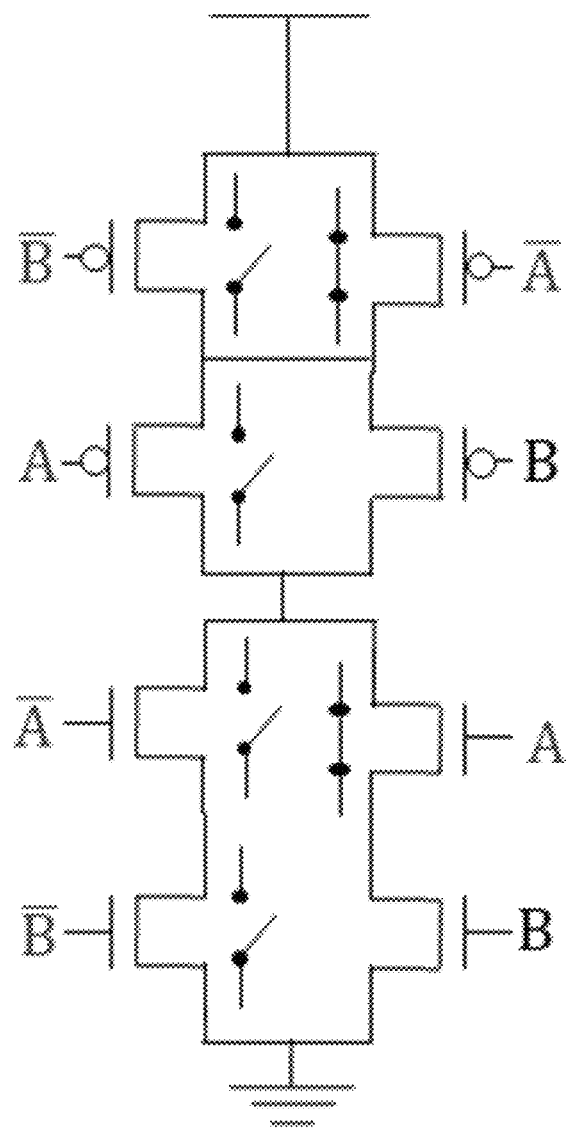

FIG. 21 shows a covert XOR gate.

Figure 22:
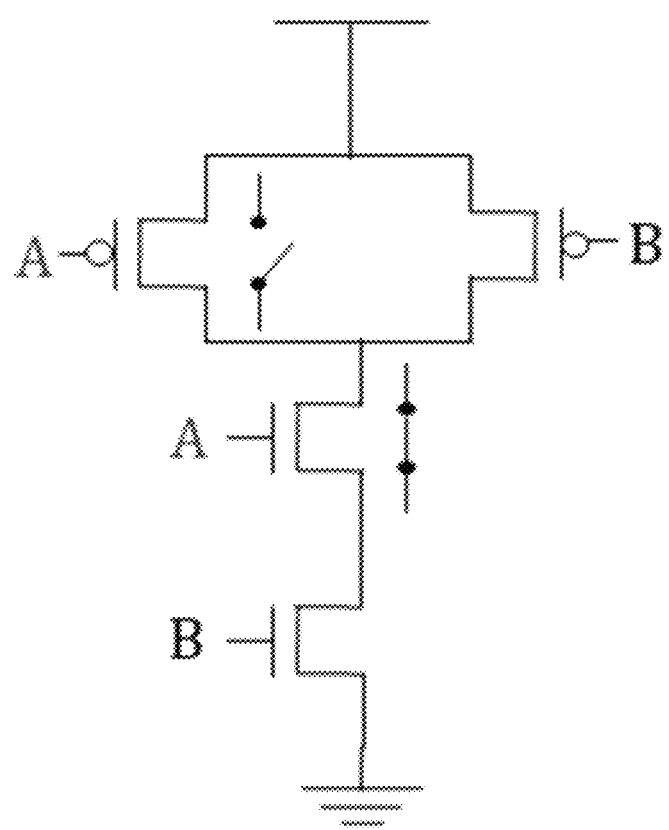

FIG. 22 shows a covert NAND gate.

Figure 23:
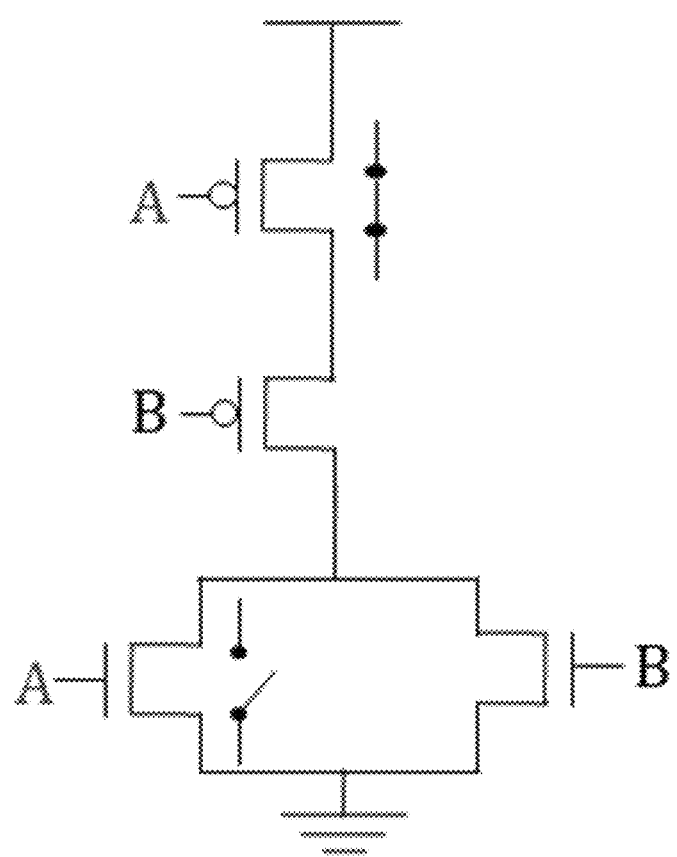
Figure 24:
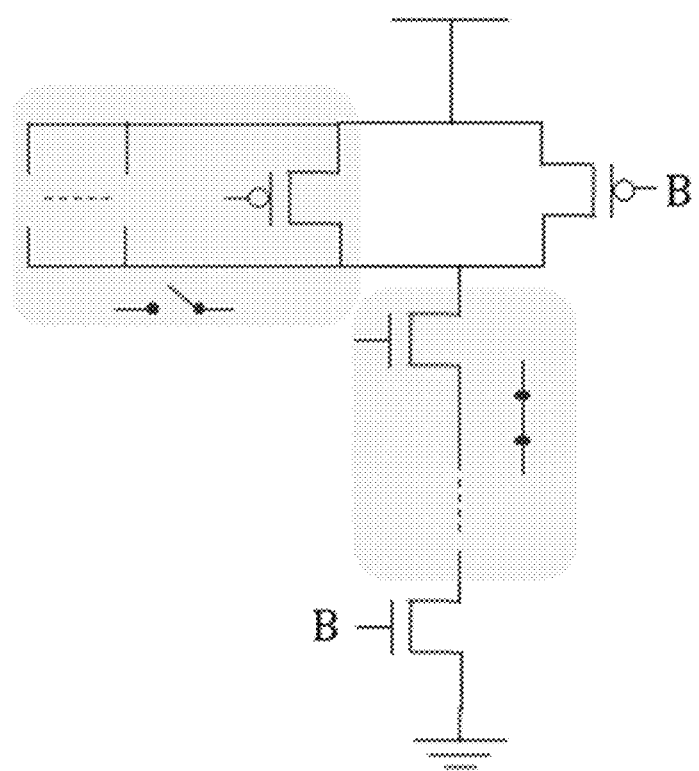

FIG. 23 shows a covert NOR gate,

FIG. 24 shows the same type of covert NAND gate as FIG. 22, but with multiple always-off PMOS transistors placed in parallel with regular PMOS transistors, and multiple always-on NMOS transistors placed in series with regular NMOS transistors.

Figure 25:
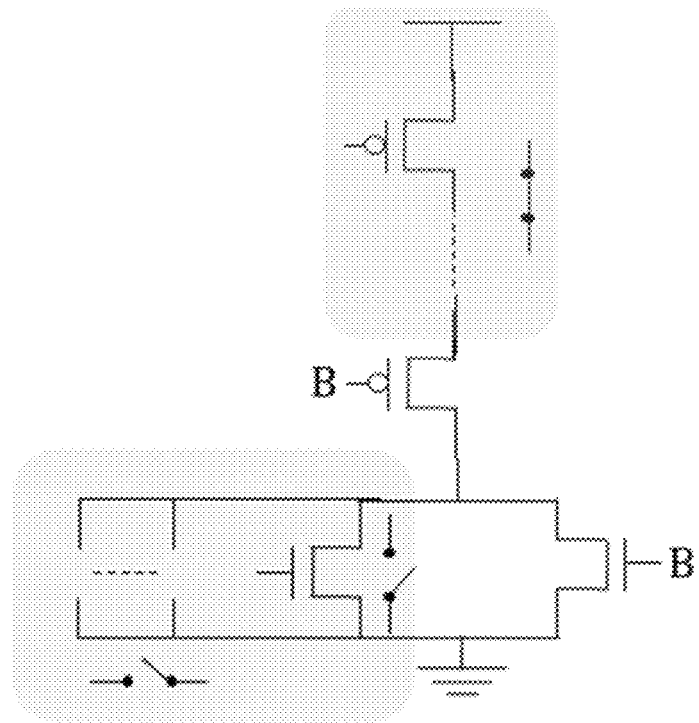

FIG. 25 shows the same type of covert NOR gate as FIG. 23, but with multiple always-on PMOS transistors placed in series with regular PMOS transistors, and multiple always-off NMOS transistors placed in parallel with regular PMOS transistors.

Figure 26:
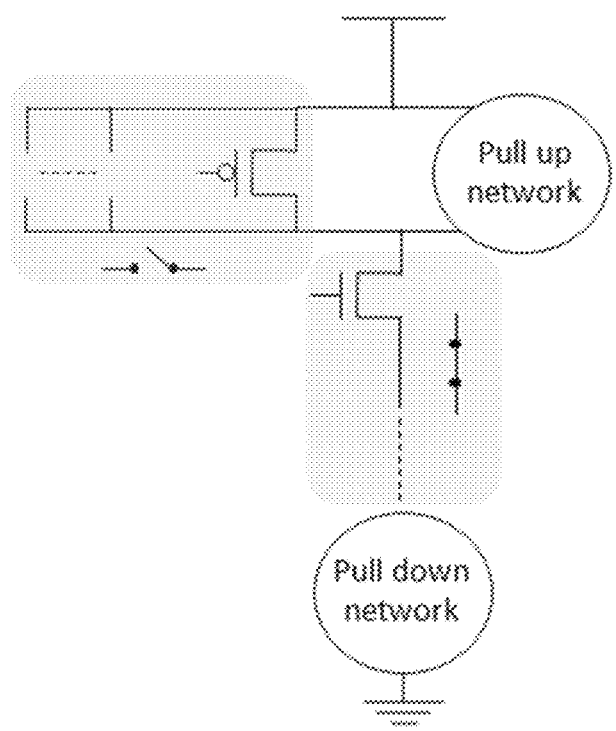

FIG. 26 shows a generalization of a covert NAND-type gate.

Figure 27:
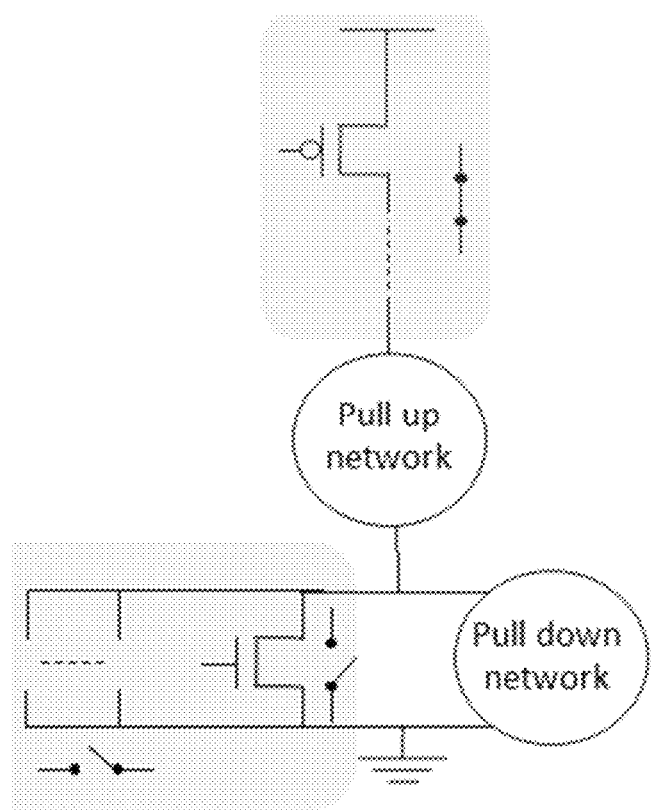

FIG. 27 shows a generalization of a covert NOR-type gate.

DETAILED DESCRIPTION OF SOME EXAMPLE EMBODIMENTS

Various embodiments of the present invention now will be described more fully hereinafter with reference to the accompanying drawings, in which some, but not all embodiments of the inventions are shown. Indeed, these inventions may be embodied in many different forms and should not be construed as limited to the embodiments set forth herein; rather, these embodiments are provided so that this disclosure will satisfy applicable legal requirements. The term "or" (also designated as "/") is used herein in both the alternative and conjunctive sense, unless otherwise indicated. The terms "illustrative" and "exemplary" are used to be examples with no indication of quality level. Like numbers refer to like elements throughout.

The present disclosure includes the following:

CMOS compatible covert gates are disclosed based on doping modification and dummy contact are.

These gates can be created by minor changes in the foundry fabrication process, without incurring high costs.

Fabrication Methods and SEM imaging results on structures with various doping and material stacks are described, demonstrating that even with state-of-the-art SEM used for reverse engineering, the modification used to create the covert gates cannot be resolved. An embodiment according to the present disclosure provides a camouflaging strategy with definitive results on SEM imaging resistance.

Circuit models are presented for the covert gates that allow overhead assessment during the design phase.

Finally, SAT is performed as well as test (ATPG)-based security analysis of designs camouflaged with this technique under multiple scenarios, and quantitatively demonstrate that both attacks do not scale well for compromising designs that contain the covert gates.

As a summary of the disclosure, section 1 reviews the state-of-the-art in IC camouflaging. It also explains the adversarial model used and the attacks proposed so far in the context of camouflaging. Section 3 introduces covert gates (the camouflaging technique), along with motivation, logic gate construction and overhead characterization. It also provides SEM imaging results to demonstrate that the doping scheme used to construct the proposed camouflaged gates is not detectable. Section 4 analyzes resiliency of the proposed scheme to SAT-based attacks. Section 5 describes how test generation techniques can be used to analyze camouflaging security. Section 6 provides results on SAT and ATPG attacks on the covert gate strategy. Finally, Section 7 concludes the disclosure.

1. IC CAMOUFLAGING 1.1 Scope and Attack Model

IC camouflaging intends to protect semiconductor IP once a manufactured chip enters the open market and finds its way into the hands of an adversary. The design house or entity designing the chip as well as the foundry fabricating the chip are assumed to be trusted. The problem of untrusted foundries is usually tackled by techniques such as logic locking, and is beyond the scope of camouflaging, since the foundry has the mask information needed to fabricate the camouflaged cells. As in previously proposed camouflaging approaches, it is assumed that the reverse engineer has access to the following:

The design netlist which is obtained after performing IC reverse engineering and includes camouflaged cells with unknown functions.

A functional chip which the attacker can use as an oracle (i.e., apply input patterns and observe known-good responses). This is because camouflaging does not affect the functionality of a manufactured chip; rather, it only prevents an adversary from obtaining a functionally correct netlist after imaging the chip.

Scan chain access is also commonly assumed. A scan chain, shown in FIG. 3, is made by chaining together all the flip-flops in a design to form a shift register. Here PI, SI, SE, CLK, CLC, and PO stand for Primary Inputs, Scan In, Scan Enable, Clock, Combinational Logic Cone and Primary Outputs. This design allows a user to excite each combinational logic cone (CLC) in the design with their input vector of choice 10. To do so, input vectors are loaded through the scan-in (SI) port instead of the primary input (PI). After several clock cycles, the vectors are loaded onto each individual CLC. Then, the responses can be readout by running the IC for one clock cycle and scanning out the results. This is vital because the presence of a scan chain transforms a sequential circuit into several small combinational circuits, each of which can be accessed individually. If the scan chain was not present, loading of desirable input vectors into each specific CLC would not be feasible, as many CLC's would not be accessible directly via the primary inputs (PIs). An attacker cannot excite camouflaged cells with desired input vectors and observe their behavior without this capability.

1.2 SEM Imaging for Reverse Engineering

When the IC feature size went below the optical spatial resolution (<1 µm), SEM became the tool-of-choice during the imaging step of IC reverse engineering flow. SEM is a powerful magnification system that employs focused electron beams (e-beams) to capture information from a sample surface. Various properties of the sample surface, such as topography, conductivity, chemical component, and surface potential, can be revealed by SEM imaging. Although the feature size of modern ICs has scaled down to sub-10 nm, SEM imaging resolution capabilities have also grown. For certain materials, SEMs can achieve sub-1 nm spatial resolution. In addition, SEM is able to perform imaging over a large surface in an efficient manner, compared to other microscopy techniques such as transition electron microscope (TEM), atomic force microscope (AFM), etc. Thus, due to its high resolution and efficiency, SEM is the most popular imaging technique for IC reverse engineering. Hence, any secure camouflaging technique must be resistant against SEM imaging, as the images obtained from SEM are directly used for annotation and netlist extraction.

The most challenging part of IC reverse engineering is recognizing different doping regions and gates in the transistor layers. This is due to the weak contrast and reduced resolution resulting from material similarities 111. Beside surface materials and topography-phy (which are the two most common contrast sources for SEM), passive voltage contrast (PVC) is also necessary for feasible imaging of the transistor features. Two factors are essential for PVC: surface potential and charging effect. Depending on the doping type and the doping concentration, the surface potential of silicon (Si) varies. Such variations can be captured by SEM 12 and 13. It is worth noting that although 1 nm wide doped features were detected, the feature width in the final image was larger than 20 nm. In this case, if the two doping regions are closer than 20 nm, they cannot be differentiated. Besides doping, the CMOS structure itself also causes grounding effects, which decide the charge accumulation rate on the sample surface. Moreover, the accumulation of surface charge changes the surface potential, and thus, affects the SEM images. It is also reported that primary electron (i.e., e-beam) energy is important for doping-based SEM image contrast. Low energy (<5 keV) has been suggested. For IC imaging, the e-beam energy is critical for yet another reason: the penetration depth (i.e., reaction volume). Higher energy e-beam goes deeper into the material and provides more information from the deeper layers. Because some layers in an IC are as thin as a few nanometers and the signal-to-noise ratio (e.g., from doping-related information) can be weak, the contrast of such layers will be easily lost by using a high energy e-beam.

1.3 Invasive Attacks

After reverse-engineering, an attacker has access to a gate-level netlist. In the case of existing camouflaging techniques, he/she also knows which exact cells are camouflaged in the design. The limited number of camouflaged gates could allow an attacker to feasibly conduct various invasive attacks on each of the camouflaged cells and, thereby, recover their functionality. For example, a disclosed de-processing technique allows high resolution milling of circuit layers using plasma focused ion beam (FIB) tools. Using FIBs, an attacker could mill the metal contacts to observe the presence (or absence) of insulating layers. Optical probing techniques, such as photon emission probing, laser-induced fault injection, and laser voltage probing (LVP), allow observation of gate-level switching activity, which can be used to help recognize the camouflaged gate functions. Compared to regular camouflaging, the disclosure severely limits the ability of the attacker to conduct invasive attacks to resolve the covert gates. This is because he/she is forced to apply FIB milling/imaging or LVP on every single gate in the design (as covert gates are identical in layout to regular standard cells). This is clearly infeasible, considering the time required to perform the invasive attacks and the number of gates in modern designs.

1.4 Non-Invasive Attacks on Camouflaging

While an attacker can perform invasive attacks on each individual camouflaged cell, the presence of the netlist and a functional IC with scan chain access also makes it possible for an attacker to non-invasively reveal the identity of the camouflaged gates. Such attacks would be favored over invasive ones, in scenarios where the attacker does not have access to state-of-the-art probing and imaging tools. Two significant types of such non-invasive attacks have been proposed on camouflaging techniques, where a given cell can implement one of N different functions.

1.4.1 Test-Based Attacks

In test-based attacks (also referred to as ATPG-based attacks), the attacker leverages common test generation techniques as well as the on-chip scan chain mechanism to excite individual camouflaged gate inputs. Once the camouflaged gate is stimulated, its response is propagated to an observable output point (for example, the primary outputs or scan flip-flops). This response can then be checked against the response from a functional IC to decide the Boolean function of the camouflaged gate. For example, a 2-input camouflaged gate implementing either NAND, NOR or XOR can be stimulated with the vector <00>. If its response is observed to be 0, one can be certain that the gate implements XOR. This attack requires two actions to be performed:

Sensitize: It should be possible to set the input pins of the camouflaged gates to the desired value through either the primary inputs or via the scan chain.

Propagate: Once the camouflaged gate's pins are set to the desired value, the output of the gate should be propagated to an observable point such as the primary output or a flip-flop (from which it can be flushed out to the scan-out port via the scan chain). This requires that every other gate in the path between the camouflaged gate and the observe-point be set to a non-controlling value. Otherwise, the output of other logic gates would interfere or mask the camouflaged gate's logic value and render it un-observable.

1.4.2 SAT-Based Attacks

In SAT-based attacks, it is also assumed that there is scan access so that the design (usually sequential) reduces to several combinational circuits. Once this is done, each camouflage gate is replaced with a selection network as shown in FIG. 4, controlled by key variables. FIG. 4 is a schematic of a SAT formulation for resolving camouflaged gates. The original gate is unresolvable by imaging (→camouflaged gate). The camouflaged gate is represented by multiple functionalities determined by a key variable (→MUX network controlled by key bits). Now, the task of the solver is to find the correct 'key values' so that the camouflaged netlist is functionally equivalent to the IC. Once the 'key' is found, the multiplexer network is replaced with the correct gate assignment, leading to a fully resolved netlist. For example, in FIG. 4, the key values $k_0=0$, $k_1=1$ lead to a correct assignment, as the original gate that was camouflaged was an XOR. Recent results have shown that the attack only requires a few input-output observations from a functional IC to rule out incorrect camouflaged gate assignments and converge on the correct identity of the gates.

Several circuit-level countermeasures have also been proposed to resist SAT-based attacks. These techniques mainly focus on limiting the information gained by the solver from the functional IC i.e., they reduce the number of incorrect key or camouflaged gate assignments that can be ruled out in a single iteration, thereby requiring the solver to take an exponential number of iterations to reveal the gate identities. This is usually achieved by the insertion of "SAT-resistant logic" (e.g., AND trees or point functions) into the circuit. However, they come at the cost of either reduced circuit corruptibility (i.e., even with the wrong camouflaged gate assignments, the circuit is functionally still very similar to the original design), susceptibility to removal attacks, or susceptibility to bypass attacks. Further, these techniques are also vulnerable to "approximate SAT" or AppSAT attacks. In contrast to regular SAT attack, AppSAT intermittently computes the error rate of the circuit (using logic simulation) and terminates the attack if the error rate drops below a predefined threshold. This is helpful as regular SAT attack only terminates if it finds a provably correct camouflaged gate assignment. Unfortunately, this prevents the algorithm from terminating early, even if its current key assignment has a sufficiently low error rate (i.e., most of the camouflaged gate assignments are correct). On the other hand, AppSAT guarantees an "almost correct" key (i.e., most camouflaged gate identities are resolved) while quickly converging.

1.5 Survey of Current Techniques

Several techniques for creating and integrating camouflaged gates have been disclosed. They can be grouped into the following categories.

1.5.1 Dummy Contact-Based Camouflaging

The most widely known embodiment of camouflaging leverages dummy contacts to create a cell capable of implementing a variety of Boolean functions shown in FIG. 5(a). In these cells, some contacts between the metal layers and the gate are actual tungsten contacts whereas others have a fine insulating layer of silicon dioxide $SiO_2$ separating the logic gate terminals and metal layers. When imaging is performed on these gates, it is believed to be difficult (if not impossible) to observe the validity of the contacts from the IC frontside or backside. Therefore, without valid contact information, the identity of the camouflaged gate is not revealed.

The drawback of such an approach is the high overhead incurred. As each camouflaged gate contains a large number of transistors (whose connections can be configured by the dummy contacts), the area, delay and power characteristics of these cells are much higher than regular standard cells. For example, a camouflage NAND gate that can be configured as a NAND, NOR, or XOR gate is reported to have power, delay and area overheads of 5.5×, 1.6× and 4× respectively. Thus, a designer needs to devise various techniques for insertion of a limited number of such cells into the design. Further, such techniques have also been shown to be vulnerable to both SAT and test-based attacks. Test-based attacks are countered by inserting camouflaged gates in such a way that their logic function cannot be resolved by sensitization and propagation. However, SAT-resistant camouflaging is harder to achieve, as it may lead to low output corruptibility, more overhead or the inserted extra logic to counter SAT attacks may be prone to further attacks, as discussed in Section 2.4.2. It should also be noted that the basis of both SAT and test-based attacks is that an attacker can tell which gates in the extracted netlist are regular standard cells and which are camouflaged cells. If all gates in a design were camouflaged, both SAT and test-based attacks would be thwarted, albeit at unreasonable overheads.

1.5.2 Threshold Voltage-Based Camouflaging

Several techniques that configure a logic gate into various functions, depending on the threshold voltage configuration of the transistors, have also been proposed. A new circuit structure was proposed before which is composed of pass transistors with varying threshold voltages ($V_t$). Depending on the configuration of the threshold voltages, the same structure can function as an AND gate or an OR gate. Another threshold voltage-based approach using sense amplifier-based logic (SABL) is experimentally demonstrated, where the $V_t$ of transistors in a camouflaged gate is programmed post-fabrication using intentional hot carrier injection in FIG. 5(b). In threshold-defined pass transistors, which can either be programmed as open or closed based on their $V_t$ configuration, are used in the design of multi-functional camouflaged gates.

Similar to dummy contact-based camouflaging, these techniques come at the cost of high area, delay and power overheads. For example, a threshold voltage-defined NAND gate proposed in 24 consumes 9.2× power, 6.6× delay, and 7.3× area overheads. Further, from a security perspective, they have the same vulnerability to SAT and test-based attacks as dummy contact-based camouflaging. This is because the $V_t$-based camouflaged gates, regardless of their mode of implementation, can be replaced with a formulation as shown in FIG. 4 and consequently, resolved by SAT attack.

1.5.3 Doping-Based Camouflaging

The manipulate dopant polarity in the layout of logic gates to perform camouflaging. Depending on how the doping is adjusted in the NMOS and PMOS transistor regions, the same cell (termed as an "obfuscell") can behave as an inverter, buffer or a cell that always outputs logic 0 or logic 1, as shown in FIG. 5(c). In FIG. 5(c), the "obfuscell" can be configured as an inverter, buffer or be stuck-at-1/0. The cell is combined with a logic gate to create a multi-functional "ObfusGate". These obfuscells can then be used to create complex "obfusgates" that implement a large number of functions, depending on the obfuscell configuration. Similar to dummy contact and $V_t$-based camouflaging, obfusgates suffer from high overheads. For example, an average of 7.09× area, 6.45× power, and 3.12× delay overhead was incurred while using the NAND-type obfuscation gate on an AES S-Box circuit. The approach has also been shown to be vulnerable to SAT attacks 27. Further, the doping scheme used to implement obfuscell can be detected by imaging.

1.5.4 Interconnect Camouflaging

People have taken the route of obfuscating the interconnects instead of modifying the logic gates. They propose the use of magnesium wires that instantly oxidize on exposure during reverse engineering and become indistinguishable from dummy wires that are made of magnesium and have been oxidized intentionally during the fabrication. Therefore, each gate has a large number of possible input/output pin choices.

It has been shown that such transformable interconnects can also be attacked by replacing the unresolvable interconnects with a MUX or switch network and using the SAT attack algorithm to find the key that configures the suspect interconnects correctly. Further, no imaging results were presented to see if there was any difference between the dummy magnesium oxide interconnects and the magnesium interconnects that oxidize on exposure to air. It is also unclear if there are fabrication, volatility, and reliability challenges associated with magnesium interconnects.

A comparison of all these camouflaging techniques with the covert gate is presented in Table 1. It shows that covert gate is the only low overhead approach that is resistant to various attacks, without the need for any additional countermeasures.

Table 1: Comparison of various regular camouflaging techniques, where a camouflaged gate assumes one of N logical functions, and covert gates. Note that some techniques are SAT or test attack resistant after application of countermeasures (these are marked as ( ). If the technique is naturally resistant to such attacks without any countermeasure, and marked as ✓. "?" implies that the particular feature of the approach is unverified.

TABLE 1

| | Regular Camouflaging | | | | |
| --- | --- | --- | --- | --- | --- |
| Feature | Dummy Contact | Threshold Voltage | Doping | Transformable Interconnects | Covert Gates |
| SAT resistant | X | X | X | X | ✓ |
| Test attack resistant | X | X | X | X | ✓ |
| Low overhead | X | X | X | X | ✓ |
| Configurable after fabrication | X | ✓ | X | X | X |
| Imaging resistant | ✓ | ✓ | ✓ | ? | ✓ |
| Undetectable during netlist extraction | X | X | X | X | ✓ |

2. COVERT GATES 2.1 Motivation

While a plethora of techniques have been introduced for IC camouflaging, they all revolve around the same idea of creating a "special cell" that can implement a variety of functions depending on how they are fabricated or configured. Unfortunately, it has been shown that test and SAT-based attacks can compromise most of these techniques, i.e., they can reveal the camouflaged gate identities, even if their precise function cannot be resolved by inspection during reverse engineering/imaging. Countermeasures against these non-invasive/functional attacks have also proven to be costly in terms of overhead. Moreover, they have their own set of vulnerabilities (e.g., low output corruptibility and removal attack susceptibility). Towards the side of invasive attacks, a reverse engineer could use advanced probing tools (e.g., LVP) to make direct contact with the camouflaged gate pins and reveal their identity by exhaustive tests (e.g., test all four possible input combinations for a 2-input camouflaged gate).

With these limitations and vulnerabilities in mind, "covert gates" as "camouflage" is created into IC camouflaging. More specifically, logic gates that appear no different from any other regular gate in the design under SEM imaging are created. Yet, these cells are not a part of the original circuit functionality and are intended to mislead the reverse engineer so that an incorrect netlist is extracted. This leads to a fundamental issue for any kind of attack on IC camouflaging: the attacker must first figure out which gates are being camouflaged before even proceeding with any type of attack. This leads to a significant increase in complexity for the attacker, in contrast to the scenario where they are readily able to tell which cells are camouflaged and which aren't. In terms of invasive attacks, thinning/imaging and laser voltage probing would need to be carried out on practically every gate in the design, since covert gates are indistinguishable from normal ones. This would lead to infeasible cost and time for an attacker, as both FIB and LVP cannot be conducted on-the-fly on every gate in a large design. While non-invasive attacks based on SAT and ATPG are not as time-consuming or expensive as invasive ones, their scalability would also suffer, as every gate is suspect. As shown in Sections 2.4.2 and 5, the SAT-attack would need to encode a very large number of gates to resolve the covert gates, and ATPG-based attacks would also be unable to generate/propagate test patterns/responses to distinguish the gates.

2.2 Covert Cell Fabrication and Operating Principle

In order to create camouflaged covert gates that look exactly like normal logic gates but with dummy inputs, variants of regular P-type metal-oxide-semiconductor field-effect transistors (PMOS) and N-type metal-oxide-semiconductor field-effect transistors (NMOS) are required. While regular NMOS transistors conduct when a high voltage is applied to its gate (and PMOS transistors conduct when a low voltage is applied), PMOS and NMOS transistors are created and are always open (or closed), regardless of the input applied at its gate. These variants are shown in FIG. 6.

FIG. 7 shows a schematic of a 2-input NOR gate where B is a dummy input. PMOS transistor in the pull-up network (PUN) connected to B is always on (short circuit) and the NMOS transistor in the pull-down network (PDN) connected to B is always off (open circuit). As a result, the gate behaves like an inverter with input A.

Using these transistors, a 2-input NOR gate Y=NOR(A, B) are constructed, as shown in FIG. 7. If an always-on transistor is used in the pull-up network (behaving as a shorted wire) and an always-off transistor in the pull-down network (behaving as an open wire), the input applied to pin B no longer affects the functionality of the NOR logic gate. Thus, the output Y will be high (low) whenever the input A is low (high). Thus, the N OR gate is transformed into an inverter, with a dummy input B. In a similar fashion, AND, OR, NAND, XOR and a variety of other gates can be camouflaged by using a combination of always-on/always-off transistors to create n dummy inputs.

2.2.1 Prior Work on Always-On/Always-Off Transistors

Note that such type of camouflaged gates with always-on/always-off transistors have previously been proposed and briefly discussed as well. There lightly-doped drain (LDD) structures with opposite doping polarity in the source/drain regions are used. The LDD regions act as insulators, creating an open defect in the transistors. Such LDD-based structures were leveraged to create gates with dummy or "stuck-at" inputs, through a combination of always-on/always-off transistors. However, it should be noted that such LDD-based structures are quite costly to fabricate. This is because regular LDD structures have the same polarity as that of the source/drain regions (i.e., n-type doping is applied on the LDD region and n++in the source/drain region for NMOS). To create a stuck open fault, a p+ doping is applied in the LDD region along with n++in the source/drain region (for NMOS). As self-alignment is not possible, doping would need to be performed precisely on the LDD regions with accurate alignment, which is extremely difficult for newer technology nodes. Further, it can be expected that the junction between the highly doped LDD and source/drain regions will create high leakage current. It is also unclear if such structures are invisible under SEM imaging. Further, they do not propose a fabrication mechanism to create the always-on transistors, which are needed to complement the always-off transistors in this embodiment.

2.3 Design of Device Structure and Fabrication

In this Section, a method to fabricate the transistors as covert gates using CMOS compatible technologies is disclosed.

2.3.1 Always-On Transistor

FIG. 8 illustrates the unique fabrication steps needed to implement this structure of making the covert gate to set a transistor as "always-on". It shows the regular (left) and "always-on" transistors (right) by modifying the doping in the channel regions. The mask used for each step is shown in top view, while the sample obtained after each step is shown in cross-section.

The transistor is fabricated with a heavily doped implanted channel, with the same doping type as the source and drain. The dopant concentration should be higher than the effective carrier concentration in a strongly inversed layer. Consequently, the heavily doped channel will not be significantly affected by gate bias and the contacts between source/channel and channel/drain are low-resistance Ohmic contact. A permanent "stuck-on" fault is thus formed intentionally. Referring to FIG. 8, with NMOS as an example. The fabrication starts from Si doping. Depending on which parts of the design need to be camouflaged, regions on a wafer to be used for the channels of "always-on" FETs are first defined. Then, a heavily doped but shallow (<10 nm) region is formed by ion implantation. The doping is performed on a slightly large area, which should ensure that the whole channel is covered while the neighbor FETs are not affected. After this, all the processing steps follow the same flow as regular fabrication.

2.3.2 Always-Off Transistor

FIG. 9(b) illustrates the unique fabrication steps needed to implement this structure of making the covert gate to set a transistor as always-off. As a comparison, the steps of making a regular contact in a transistor is also shown in FIG. 9(a). The "dummy contacts" can be applied on the gate and source terminals. In this approach, the contacts connecting the transistor terminals to metal layer 1 are interrupted by insulating thin films. Note that in dummy contact-based camouflaging, the insulating layer causing an electrical disconnect is applied on several contacts in the cell. For covert gates, only an insulating layer on the gate and source terminals is required. Due to the insulating film, the bias that turns on the transistors cannot be effectively applied on the gate. Further, the insulating layer on the source terminal cuts the transistor connection to VDD (for NAND-type gates) and GND for NOR-type gates. As a result, a strong inversion layer (i.e. the conducting channel) is prevented from forming, even with bias applied, and the transistors always stay as "off". The fabrication of such "dummy-contacts" is similar to the forming of an electrical discontinuity in the interconnect. As shown in FIG. 9(b), regular contacts are first fabricated. Then, the dielectric material (e.g. $SiO_2$) of the "always-off" transistor is etched to open an orifice for metal filling. Before the metal filling, a conformal thin layer of the dielectric material ($SiO_2$) is coated in the orifice. Given enough thickness, the dielectric thin film serves as a "stopper" to prevent the switching-on of the "always-off" transistor over the frequency range that the chip is supposed to work on.

2.4 SEM Imaging Attack Analysis

In covert gates, one MOS transistor is always made as "always-on" and the complementary one as "always-off" for one or more inputs. Thus, the adversary needs to find out at least one type of modification (heavily doped channel or dummy contact) to locate the covert gates. Considering that the materials exposed on the surface (typically the drain, source, and contacts) are like regular transistors, imaging-based recognition of the doped channel relies on passive voltage contrast (PVC). SEM sample preparation (i.e., removing materials to expose the active layer) can be performed in two ways: from the backside, or the front side of the IC. As discussed in Section 2.2, PVC imaging mainly depends on the surface charging effect. If the imaging is done from the backside, the contacts, metal layers, and vias, which make various connections among MOSFETs, are preserved. Therefore, the conducting volume corresponding to each region will be different and the charging of each region varies as well. It is thus very difficult to correctly extract modified doping information from the backside. Thus, front-side imaging would be preferred for detecting doping changes.

Figures 10A, 10B, 10C, 10D:
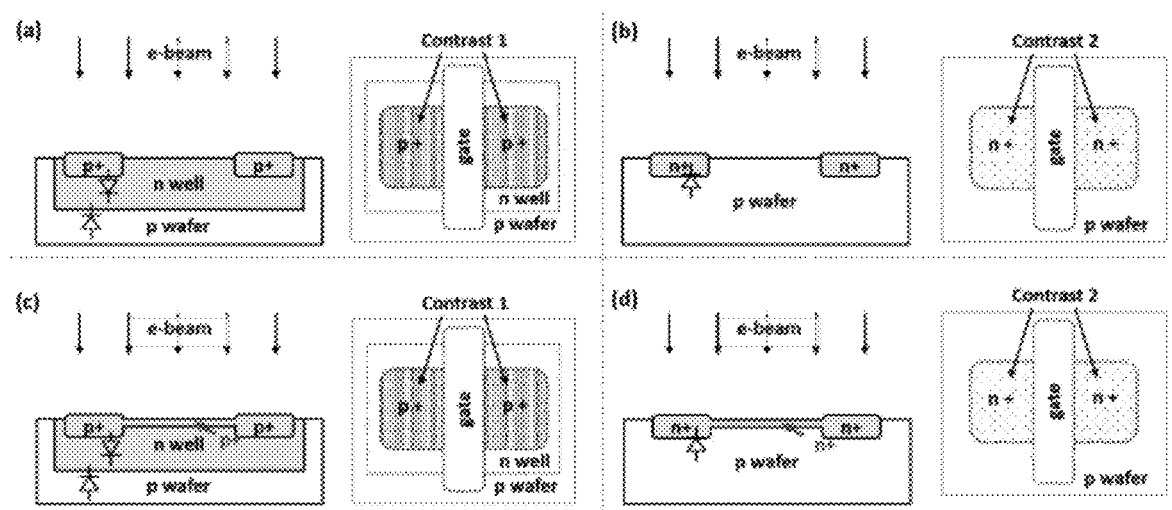

FIGS. 10(a)-(d) illustrate the effective conduction volumes (grayed on the cross-section views) between PMOS and NMOS. The change between regular PMOS in FIG. 10(a) and always-on PMOS in FIG. 10(c) is insignificant. The change between regular NMOS in FIG. 10(b) and always-on NMOS in FIG. 10(d) is also insignificant.

When imaging is performed from the front side, an ideal sample preparation procedure should expose the silicon surface (i.e., remove all the contacts, gates, and oxides) while leaving enough of the doped region, as shown in FIGS. 10(a) to (d). When the e-beam is scanning across a PMOS transistor, negative charges (electrons) accumulate in the p-type source and drain, and n-type well. On the other hand, for an NMOS transistor, the negative charges accumulate in the n-type source and drain. Positive charges (electron escaping) can be analyzed in a similar way. When comparing regular and "always-on" transistors, the shorted channels should contribute to the conduction volume change. If such a change is significant it should help an attacker to detect the modification. However, in the proposed "always-on" PMOS transistor, the shorted channel takes a volume from the n-well, without changing the total conduction volume in gray regions in FIGS. 10(a) and 10(c). For the proposed "always-on" NMOS, the shorted channel is an additional conduction volume and thus increases the total volume in gray regions in FIGS. 10(*b*) and 10(*d*). However, compared to the thickness of source and drain (typically few tens of nanometers), the thickness of the shorted channel (controlled within a few nanometers by low energy ion implantation) is quite limited, resulting in the conduction volume increasing by less than 10%. This increase is comparable to processing variations and should be very difficult to be distinguished by PVC-based imaging.

2.5 SEM Imaging on Fabricated Devices

To demonstrate the indistinguishability of the proposed devices, devices with different feature sizes are fabricated. The SEM images can be taken with an advanced SEM instrument, for example, the Tescan LYRA-3 FESEM and FEI Nova Nano-SEM 430 (FESEM).

FIG. 11 illustrates the doped regions of PMOS transistors for regular and "always on" cases under different imaging parameters: (0.3 keV, SE), (5 keV, SE), (10 keV, SE) and (5 keV, BSE). There are 2 sets of transistors with channel lengths varying from 90 nm to 20 μm for both.

As shown in FIG. 11, the sources, drains, and channels of regular and "always-on" PMOS transistors are fabricated on one wafer with different channel lengths. In each set, there are transistors with channel lengths varying from 90 nm to 20 μm. The channel width is two times the length. All source and drain regions are defined in the square shapes. As described in Section 3.3, the channels of the "always-on" transistors are first doped by ion implantation (boron, 2 keV, $5\times10^{13}$ cm$^{-2}$) to achieve a hole concentration of $1\times10^{19}$ cm$^{-3}$ within 5 nm surface layer, providing more effective charge carriers than a strong inversion layer in PMOS. Subsequently, the source and drain of both regular and "always-on" transistors are doped by ion implantation (boron, 15 keV, 1 $10^{16}$ cm$^{-2}$), giving doping concentration about $1\times10^{20}$ cm$^{-3}$ to $1\times10^{21}$ cm$^{-3}$ within 100 nm surface layer. To identify the transistors, various e-beam energies (0.3 keV-30 keV) are used. Different detectors, including secondary electron scattering (SE) detector and back scattered electron scattering (BSE) detector are also employed. Based on the contrast and spatial resolution, optimal images are obtained with 5 keV by BSE (FIG. 11). As can be seen in the FIG. 11, no difference between the regular and "always-on" transistors is observed on the SEM images. It also worth noting that although low keV has been suggested for PVC-based imaging in 12, 13, and 14, discussion about the spatial resolution of PVC-based imaging (which is different from regular SEM imaging) was missing. With regards to those studies, resolution was not an issue as the size of the presented sample devices were large (micron level). However, for newer technology nodes, the spatial resolution of low keV PVC-based imaging is insufficient to provide enough resolution. For example, with 0.3 keV beam energy, the small transistors with channel length of 90 nm and 300 nm cannot be successfully recognized (FIG. 11, zoomed-in regions at the bottom).

FIG. 12 shows SEM images of doped regions of NMOS transistors for regular and "always on" cases. Regular NMOS and "always-on" NMOS transistors are also fabricated in a similar fashion, by using phosphorus as the dopant (5 keV, $5\times10^{13}$ cm$^{-2}$ for modified channels; and 40 keV, $1\times10^{16}$ cm$^{-2}$ for sources and drains). The imaging results are the same as that for PMOS: the modified doped channels cannot be distinguished from the regular ones by visual inspection.

FIG. 13(*a*) illustrates a schematic diagram of a regular contact and FIG. 13(*b*) shows that of a dummy contact for "always-off" transistors. Their top views of SEM images are shown in the lower picture FIG. 13(*c*) under SE and BSE imaging conditions. For the 'always-off' transistors, simplified metal structures with silicon oxide are fabricated to analyze the difference in imaging between regular contacts and dummy contacts. Due to fabrication facility limitations, gold is used as the metal material, which is easily deposited without getting oxidized during fabrication (which became an issue for copper). For the regular contacts, the thickness of the gold is 200 nm. For the dummy contacts, a stacked structure of gold-100 nm/SiO$_2$-10 nm/gold-100 nm was prepared. The diameter of the contacts and the dummy contacts varies from 100 nm to 1 μm. Because of charging effects, the best quality images are obtained with e-beam energy at 5 keV. Both SE and BSE images are obtained here. From the SEM images, regardless of the sizes, no difference is observed between the structures representing regular contacts and dummy contacts. This is because the contrast is mainly dependent on material differences (metal vs SiO$_2$). However, the charging that may affect the contrast (and thus, imaging results) in both structures mostly comes from the surrounding SiO$_2$, instead of the metal and/or SiO$_2$ between the metal contacts. Therefore, any structural difference between regular and dummy contacts cannot be observed.

FIB (Focused Ion Beam) is used to detect the channel doping used for creating the always-on transistor. However, surface damage and lower resolution with the FIB, resulting in very poor imaging at nodes below 300 nm. This is also in line with the observations, where the contacts on top of the dopant-varying regions were only partially distinguishable when observed with FIB i.e., results were worse than with SEM.

2.6 Cell Modeling

In order to characterize the power and performance characteristics of the covert cells, a simplified circuit model is developed for the always-on and always-off transistors, which is explained below and also shown in FIG. 14.

FIG. 14 illustrates the modeling result of the always-on transistor and always-off transistor. W represents the tungsten metal contact, p+ is the heavily doped diffusion region and SiO$_2$ is the insulating layer 1440 on the gate and the insulating layer 1441 on the source terminals, modeled by a parallel plate capacitor.

Always-On: The always-on transistor 1410 with its enlarged structure 1420 has a behavior, which is replicated with the help of depletion mode transistors. Depletion mode devices are identical to enhancement mode devices (i.e., regular NMOS/PMOS devices), except in one regard: in regular enhancement mode devices, the channel between the source and drain terminals is formed once an appropriate gate voltage is applied. In contrast, depletion mode devices come with "pre-made" channels, created through deliberate ion implantation. When a negative gate bias is applied, the channel stops conduction (for NMOS). Here, a negative bias is never applied on the always-on transistors (for NMOS). Therefore, regardless of the logic level applied to the input, the transistor is always on.

Always-Off: The always-off transistor 1430 with its enlarged structure is modeled with the combination of a regular NMOS/PMOS device and a parallel plate capacitor in series with the dummy input pin and the gate input, as well as between the source terminal and GND (for NOR-type gates, with the always-off transistor in the pull-down network). The capacitor models the metal-insulator-metal (i.e., Tungsten-SiO$_2$-Tungsten) stack on the transistor gate, with a dielectric layer 1440 in the gate and 1441 in the source, with the capacitance approximated by:

$$C = \frac{\varepsilon_{SiO_2} WL}{t_{SiO_2}} \quad (1)$$

Here, $\varepsilon SiO_2$ is the relative permittivity of $SiO_2$, W, L are the width and length of the contact, and $tSiO_2$ is the thickness of the insulating $SiO_2$ layer.

There is not an insulating layer between metal 1 and the drain terminal, as the two NMOS transistors share the drain terminal (and thus, the drain contact). If an insulating layer was put on the drain contact, the normal NMOS transistor's drain terminal would also be cut off, which is not desired. Also, it should be noted that this model is similar to that of a floating gate transistor, but without a separate voltage source and additional capacitance to model tunneling 31. This is because the applied voltage levels in a logic gate do not reach the high voltages required for tunneling (e.g., >9V). However, in this simulation, a very high resistance in parallel with the capacitors is included, as SPICE simulators do not handle floating nodes. Using this simplified circuit model, SPICE simulations are performed on 2-input NAND and NOR gates (with one of the inputs being dummy), using 90 nm device parameters from 32 and 33. Delay overheads were obtained by averaging max (tphl, tplh) over all possible input patterns. Dynamic power was estimated with an average of (fall power+rise power), and static power was measured by monitoring the current when the output of the gate was static over several 1 ns windows. From the results in Table 2, the covert NAND and NOR gates have 1.82 delay compared to a regular inverter. Since no special layout is relied on, the overheads are significantly better than camouflaged gates based on only dummy contacts or threshold voltage variations. For example, the power, delay and area overheads for a camouflaged NAND gate that could either be a NAND, NOR or XOR were 5.5, 1.6 and 4 respectively 7. It can also be seen that the power consumption (both dynamic and static) of the covert NAND and NOR gates are much lower than that of an inverter. This is because the inverter (INVX1) considered from 32 has a much larger W/L ratio than the NAND2X1 and NOR2X1 gates in the same library.

SPICE simulations are performed on the gates using sizing dimensions from NAND2X2, NOR2X2 and INVX0 gates in the SAED 90 nm library. This was done in order to compare the overhead of the covert NAND and NOR gates to a minimum-sized inverter (the INVX0 cell in the library). The results in Table 3 show that the covert NAND2X2 and NOR2X2 consume more static and dynamic power than a minimum-sized inverter, while being faster than the inverter. However, the overheads of the covert gates are still very similar to that of regular NAND2X2 and NOR2X2 gates.

Table 2: Comparison of area, delay, and power characteristics of covert gates with unit strength standard cells. It is a concern in comparing 2-input covert gates to inverters which are being replaced in the experiments. However, similar experiments can be performed by comparing 3-input covert gates with 2-input standard cells, and so on.

TABLE 2

|  | Regular Gates | | | Covert Gates | | | |
|---|---|---|---|---|---|---|---|
|  | | | | NAND2X1 | | NOR2X1 | |
|  | NAND2X1 | NOR2X1 | INVX1 | Value | Comp. with INV | Value | Comp. with INV |
| Area (μm²) | 5.53 | 6.45 | 6.45 | 5.53 | 0.86X | 6.45 | 1.00X |
| Delay (ps) | 33.59 | 50.70 | 26.84 | 36.00 | 1.34X | 48.75 | 1.82X |
| Dynamic Power (μW) | 341.22 | 191.24 | 352.20 | 254.91 | 0.72X | 244.24 | 0.69X |
| Static Power (μW) | 0.08 | 0.17 | 0.14 | 0.03 | 0.22X | 0.04 | 0.27X |

Table 3 shows a comparison of area, delay, and power of regular NAND2X2, NOR2X2 and INVX0 cells with camouflaged NAND2X2 and NOR2X2 cells.

TABLE 3

|  | Regular Gates | | | Covert Gates | | | |
|---|---|---|---|---|---|---|---|
|  | | | | NAND2X2 | | NOR2X2 | |
|  | NAND2X2 | NOR2X2 | INVX0 | Value | Comp. with INVX0 | Value | Comp. with INVX0 |
| Area (μm2) | 9.22 | 9.22 | 5.53 | 9.22 | 1.67X | 9.22 | 1.67X |
| Delay (ps) | 21.49 | 30.82 | 48.07 | 21.29 | 0.44X | 32.85 | 0.68X |
| Dynamic Power (μW) | 692.45 | 386.76 | 172.52 | 515.05 | 2.99X | 499.28 | 2.89X |
| Static Power (nW) | 403.35 | 785.21 | 3.69 | 117.95 | 31.96X | 289.98 | 78.58X |

2.7 Netlist Integration

FIG. 15 illustrates net lists of covert gates under dummy inputs. Sequential feedback loops are valid, as loops are common in sequential circuits with state. Valid and invalid net selection examples are both shown. Valid net 1550 is for the dummy inputs of the covert gates and invalid net is shown as 1510. The NOR and NAND covert gates can be integrated into a gate-level netlist by replacing an N input gate with an (N+n) input covert gate of the same type (or by replacing inverters with 2-input covert NAND or NOR gates). While performing the gate replacement, a variety of metrics is followed such as insertion into locations which are likely to corrupt the output more, insertion into locations with flipped signal probability and insertion into locations such that multiple gates interfere with each other. Such metric-guided insertion techniques have been explored quite heavily and can be chosen by the designer based on their area/delay/power budget and threat model considered. Following the simple approach of random insertion but with one important constraint: the net to be connected to the dummy input must not form a combinational feedback loop. This is because such loops normally cause undesirable oscillatory behavior in digital circuits. Although these nets would not affect the circuit functionality (since the pins are dummy), the attacker would easily be able to identify them in the design, as they violate design rules.

FIG. 19 shows a covert And-Or-Invert (AOI) gate in which input A serves as a dummy input. The PMOS transistor connected to pin A in the pull up network is always off, whereas the NMOS transistor connected to pin A in the pull-down network is always on. All other transistors serve as regular NMOS/PMOS transistors. The gate thus implements the NOR function with inputs B and C.

FIG. 20 shows a covert Or-And-Invert (OAI) gate in which input A serves as a dummy input. The PMOS transistor connected to pin A in the pull up network is always on, whereas the NMOS transistor connected to pin A in the pull-down network is always off. All other transistors serve as regular NMOS/PMOS transistors. The gate thus implements the NAND function with inputs B and C.

FIG. 21 shows a covert XOR gate in which inputs A, $\overline{A}$ and $\overline{B}$ serve as dummy input. The PMOS transistors connected to pins A and $\overline{B}$ in the pull-up network are always off, and the PMOS transistor connected to pin $\overline{A}$ in the same network is always on. The NMOS transistors connected to pins $\overline{A}$ and $\overline{B}$ in the pull-down network are always off, whereas the NMOS transistor connected to pin A is always on. All other transistors serve as regular NMOS/PMOS transistors. Thus, the gate implements the function of an inverter with input B.

FIG. 22 shows a covert NAND gate, where the input pin A serves as a dummy input. An always-off PMOS transistor connected to pin A is placed in parallel with a regular PMOS gate connected to pin B. On the other hand, an always-on NMOS transistor connected to pin A is placed in series with a regular NMOS transistor connected to pin B. Thus, the gate implements the function of an inverter with input B.

FIG. 23 shows a covert NOR gate, where the input pin A serves as a dummy input. An always-on PMOS transistor connected to pin A is placed in series with a regular PMOS gate connected to pin B. On the other hand, an always-off NMOS transistor connected to pin A is placed in parallel with a regular NMOS transistor connected to pin B. Thus, the gate implements the function of an inverter with input B.

FIG. 24 shows the same type of covert NAND gate as FIG. 22 but with multiple always-off PMOS transistors placed in parallel with regular PMOS transistors (such as the one connected to pin B). It also shows multiple always-on NMOS transistors placed in series with regular NMOS transistors (such as the one connected to pin B).

FIG. 25 shows the same type of covert NOR gate as FIG. 23 but with multiple always-on PMOS transistors placed in series with regular PMOS transistors (such as the one connected to pin B). It also shows multiple always-off NMOS transistors placed in parallel with regular NMOS transistors (such as the one connected to pin B).

FIG. 26 shows a generalization of a covert NAND-type gate. One or more always-off PMOS transistors are placed in parallel with the pull-up network of the regular CMOS logic gate, while one or more always-on transistors are placed in series with the pull-down network of the regular CMOS logic gate.

FIG. 27 shows a generalization of a covert NOR-type gate. One or more always-on PMOS transistors are placed in series with the pull-up network of the regular CMOS logic gate, whereas one or more always-off transistors are placed in parallel with the pull-down network of the regular CMOS logic gate.

The functionality of the gates shown in FIGS. 26 and 27 would only be determined by the transistors and connections in the pull-up and pull-down network, and not by the one or more always-on and always-off transistors.

In all these gates, the always-on transistor is fabricated by heavily doping the channel region to create a permanent connection between the source and drain regions of the transistor. The always-off transistors are fabricated by creating an insulating layer between the contacts and gate/source/drain terminals.

Thus, this shows how one or more dummy pins can be introduced to the most commonly used CMOS logic gates to make them covert. This approach, where the dummy input transistors are placed in either series or parallel to actual transistors, can also be easily generalized to other CMOS gates.

3. SAT ATTACK ANALYSIS

3.1 SAT Formulation

In Section 2, it was discussed how previously proposed camouflaged gates based on dummy contacts and varying functions could be resolved by a SAT-based formulation. Here, how an attacker might attempt to take a similar approach to resolve dummy pins on candidate covert gates and why it scales poorly are analyzed. Using a MUX-based selection network, the solver would return "key bits" to decide the correct permutation of pins on each candidate gate. For a candidate covert gate tt with N pins, the total number of valid permutations P would be given by:

$$P = \sum_{i=1}^{n} \binom{N}{n}, \quad (2)$$

where $1 < n < N$

A pin permutation network to transform a covert gate with function F and N pins (but an unknown number of dummy pins) is shown in FIG. 16(a). Here, the total number of choices is denoted by P, and the length of the key K is given by:

$$|K| = \log_2(P+1) \quad (3)$$

An example of the choices in the permutation network is shown in FIG. 16(b), where a 3-input NAND gate can have 7 possible candidates. The number of choices is calculated with Equation 2 as:

$$\binom{3}{1}+\binom{3}{2}+\binom{3}{3}=7 \quad (4)$$

Further, the length of key K to resolve the 7 choices would be $\log_2 (7+1)=3$. The pin permutation for NOR, AND, OR and XOR gates can also be determined in a similar manner.

Alternatively, each pin of a suspect gate can also be replaced by a MUX, whose select line is controlled by a key bit and chooses between either the pin or a non-controlling value of that gate. Thus, the SAT attack would choose the pin if it is an actual pin. Otherwise, a non-controlling constant value would be chosen for the pin in order to cancel it out (i.e., render it dummy). Both formulations help in identifying the dummy pins in a potential covert gate. Section 6.1 compares these two formulations, with respect to SAT attack time and iterations needed to solve the identity of potential covert gates.

3.2 SAT Attack Difficulty

The main difficulty in using SAT attacks to resolve the camouflaged gates would arise from:
1. The number of suspect gates that need to be encoded by a pin permutation network;
2. The number of pins N on each suspect gate.

Both factors lead to an increase in the size of the overall key K that needs to be solved by the attack. Clearly, by Equation 2 and 3, the number of choices P (and thus, the key length K) to encode an individual gate has a proportional dependency on the number of pins N it possesses. However, a standard cell library used to synthesize a netlist seldom has gates with pins in excess of 5 (i.e., N<5), since there is a heavy delay penalty associated with high fan-in gates. Thus, resistance to SAT attacks is mainly dependent on how many gates the attacker has to encode using a pin permutation network and feed into the solver. In this regard, the defender using the proposed covert gate has a clear advantage: since the attacker does not know which gates are covert gates and which aren't (this was demonstrated by imaging results in Section 3.5), he or she needs to encode every single gate. Even under simplified assumptions such as only NAND gates being suspect, the attacker would have to encode every single NAND gate in the design with a pin permutation network.

4. TEST-BASED ATTACK ANALYSIS

As discussed in Section 2, standard test generation tools can be adapted to sensitize camouflaged cells to chosen input values and propagate their responses to the outputs. This allows an attacker to decide the Boolean function of the logic gate by comparing the obtained response against that of a functional chip. In a similar fashion, the pins of the proposed camouflaged gates can also be queried with chosen inputs and their responses can be analyzed to decide which of the pin (if any) dummies are. Similar to regular camouflaging, the attack can be performed in two steps:
1. Sensitize: For each suspect pin of a (potentially) camouflaged gate, sensitize the pin to a "controlling value". A controlling value forces the output of the logic gate to a known value, regardless of the values applied on the other pins. For example, the controlling value for AND/NAND gates is 0, since a logic 0 applied on any one of the pins of a AND/NAND gate forces the output of the gate to 0/1. Here, the rationale is that a controlling value applied on a dummy pin will not affect the output of the gate. If the pin is, in fact, real, the controlling value should force the output of the gate to a known value, which can then be observed and compared against the known-good response from the functional chip.
2. Propagate: Apply "non-controlling values" to (i) all other pins of the gate currently being tested, and (ii) to all other pins in the path between the queried pin and an observepoint such as a primary output or scan flip-flop. This ensures that the effect of the controlling value on the pin being queried is observable (i.e., affects the output) and can be checked against the response of a functional IC.

These two concepts are illustrated in FIG. 17(a). In this example, generating a test to detect the (potentially) dummy pin marked by X on the NAND gate is a concern. The attack proceeds as follows:
Set the X pin to a controlling value of 0;
Set the other pin of the NAND gate to a non-controlling value of 1;
Set the net connected to the other pin of the AND gate to a non-controlling value of 1;
If the suspect pin is dummy, the circuit output should be 0; else, the output should be 1, since the suspect NAND gate behaves as an inverter.

This generated pattern <1, 0, 1, 0> can now be applied on the functional IC to confirm if the pin is indeed dummy i.e., if the obtained output is 0, the pin is indeed dummy (and vice-versa).

However, note that this type of attack has its limitations. Consider the case in FIG. 17(b). Here, the attacker is trying to discern the pin marked by X. However, the pin marked by X could also be dummy. In this case, there is no difference between the output values if the pin X is (or is not) dummy. Thus, the pin location X cannot be discerned in the presence of another dummy pin X.

In other cases, it would be possible to generate an input vector such that pin X is detected, even in the presence of X. This scenario is shown in FIG. 17(c), where a non-controlling value of 1 is applied on the pin X. Here, the output is 0 if pin X is dummy and 1 if it isn't.

4.1 Adapting ATPG Tools for the Attack

In order to execute an attack, one can use a commercial automatic test pattern generation (ATPG) tool such as Tetramax and adopt its stuck-at fault test generation mode for the attack. A stuck-at fault is a VLSI fault model in which it is assumed that a net is permanently stuck at a logic value of either 1 or 0 due to manufacturing defects. Once a stuck-at fault location is set, the tool generates an input vector that can simultaneously sensitize the net to the opposite logic value of the stuck-at fault and propagate it to an observable point. This is done so that if the fault is indeed present in the manufactured chip, applying the generated input pattern will trigger the faulty output. Note that this is exactly the "sensitize and propagate" technique that is outlined in this explanation of test-based attacks in Section 5. The only difference is that in order to sensitize a pin to its controlling value 0, a stuck-at-1 fault on the pin is set. Similarly, for sensitizing a pin to 1, a stuck-at-0 value is set on the pin.

While generating the input vectors, one also wants to make sure that scenarios such as the one in FIG. 17(b), where two or more dummy pins interfere with each other to make the output change un-observable, do not happen. In order to do this, one might set a controlling value to a suspicious pin and generate non-controlling values on all other suspect pins in its path. However, it might not always be possible to test a suspect pin while setting all other suspect pins to non-controlling values.

These two scenarios also help to explain why test-based attacks might not be able to defeat covert gates. Scenarios such as FIG. 17(b), where erroneous patterns are generated, would happen if one covert gate is in the path of another covert gate. When a sufficient number of covert gates are inserted, this scenario is likely to occur frequently, resulting in the un-detectability of dummy pins. Patterns to correctly sensitize and propagate the value on the potential dummy pin without interference—as shown in (c)—would also become harder to generate. This is because an ATPG tool might not always be able to assign non-controlling values to every pin on the required path, leading to ATPG untestable faults (i.e., undetectable dummy inputs). Moreover, note that both these issues would be exacerbated if several or all types of gates, or multiple pins on multiple gates, are suspect. These various scenarios, where an attacker has varying amounts of information on covert gates, in Section 6 and FIG. 18. Regardless, through the results, that test-based attacks only work when the attacker has the most amount of information on covert gates; it is quite limited in realistic scenarios where limited information is able on covert gate/pin identities.

5. RESULTS AND DISCUSSION

The basis of this technique is that the camouflaged gates look no different from regular logic gates in the design. However, there might be scenarios where an adversary has more knowledge about the design or covert gate constraints. For example, they might know (through an insider in the design house) that only some types of gates can be camouflaged (e.g., only NAND and NORs). In other scenarios, they might realize that only gates in non-critical paths of the design could be covert (assuming they know the operating frequency of the design). Conversely, the design house might also want to perform security analysis under similar kinds of restrictions to get a sense of how various attacks scale. FIG. 18 shows a spectrum of attack models (stronger to weaker), highlighting these different scenarios and how more (or less) information about the covert gate technique can lead to lower (or higher) attack complexity. With this spectrum in mind, both SAT and test-based attacks are conducted on the camouflaged netlist of various benchmark circuits.

5.1 SAT Attack Results

For SAT based attacks, in scenario 3 from FIG. 18, where the reverse Engineer knows that only a few types of gates can be camouflaged. For the benchmark circuits in Table 5, which are from the ISCAS'85 37 and EPFL suite 38, 2 to 4 input NAND, AND, OR, NOR gates with their respective pin permutation networks, as shown in FIG. 16. The distribution of these gates in the benchmark circuits is shown in Table 4. For regular camouflaging, 5% of the gates (NAND/NOR/XOR) is allocated which is in line with prior work and is also realistic under the high overheads.

Table 4 shows distribution of the number of 2, 3, and 4-input AND/NAND/OR/NOR gates in the combinational benchmark circuits used for SAT attack evaluation.

TABLE 4

| | 2 Inputs | | 3 Inputs | | 4 Inputs | |
|---|---|---|---|---|---|---|
| Benchmark | AND/NAND | OR/NOR | AND/NAND | OR/NOR | AND/NAND | OR/NOR |
| C1908 | 377 | 1 | 13 | 0 | 4 | 0 |
| C2670 | 457 | 63 | 112 | 2 | 11 | 22 |
| C3540 | 684 | 60 | 93 | 83 | 17 | 1 |
| C5315 | 773 | 114 | 359 | 56 | 27 | 63 |
| C7552 | 1562 | 220 | 146 | 20 | 64 | 34 |
| arbiter | 11839 | 0 | 0 | 0 | 0 | 0 |
| voter | 13758 | 0 | 0 | 0 | 0 | 0 |

Table 5 shows the comparison of SAT attack resiliency between regular camouflaged gates and proposed covert gates. Timeout is set to 12 hours for regular SAT attacks, and default parameters from 23 are used for AppSAT with a timeout of 2 hours. AppSAT is not applied to designs that were already broken by regular SAT attacks (marked by N/A). This is because AppSAT should be used only when regular SAT does not succeed. Attack time and attack iteration data given in between braces " " indicates the results obtained by encoding each pin of a suspect gate with a MUX that selects either the pin or the non-controlling value of the gate.

TABLE 5

| | | | Regular Camouflaging 5% of NAND/NOR/XOR | | | Proposed Camouflaging NAND + NOR + AND + OR | | |
|---|---|---|---|---|---|---|---|---|
| Benchmark | Gate/Node Count | \|K\| | Attack Time (s) | # Attack Iterations | AppSAT Time (Hrs) | \|K\| | Attack Time (Hrs) | # Attack Iterations | AppSAT Time (Hrs) |
| C1908 | 880 | 34 | 0.55 | 7 | N/A | 811 | 3.52 5.91 | 235 191 | N/A |
| C2670 | 1193 | 26 | 0.65 | 11 | N/A | 1514 | Timeout Timeout | 2127 4891 | Timeout |
| C3540 | 1669 | 28 | 0.68 | 11 | N/A | 2088 | Timeout Timeout | 28 34 | Timeout |
| C5315 | 2307 | 46 | 3.58 | 25 | N/A | 3379 | Timeout 4.27 | 240 459 | Timeout |

TABLE 5-continued

| | | Regular Camouflaging 5% of NAND/NOR/XOR | | | | Proposed Camouflaging NAND + NOR + AND + OR | | |
|---|---|---|---|---|---|---|---|---|
| Benchmark | Gate/ Node Count | \|K\| | Attack Time (s) | # Attack Iterations | AppSAT Time (Hrs) | \|K\| | Attack Time (Hrs) | # Attack Iterations | AppSAT Time (Hrs) |
| C7552 | 3512 | 106 | 4.07 | 27 | N/A | 4454 | Timeout Timeout | 52 91 | Timeout |
| arbiter | 11839 | 1182 | 3815.00 | 855 | N/A | 23678 | Timeout Timeout | 82 141 | Timeout |
| voter | 13758 | 1078 | Timeout | 33 | Timeout | 21560 | Timeout Timeout | 51 28 | Timeout |

In regular camouflaging approaches, after constructing the encoded circuits, the SAT attack platform is used to collect results on the number of iterations and time required to find the correct camouflaged gate assignments. The number of key bits needed to encode all the gate choices as a pin permutation network is also listed in Table 5. Timeout for the attack was set to 12 hours, which is in line with similar work. Note that the size of the benchmarks for the SAT attack experiments used are quite small. This is because the SAT attack platform, in its current form, can only handle combinational circuits. In reality, the attack would be launched on sequential circuits with scan access. This would allow the attacker to treat the large sequential circuit as a collection of much smaller combinational logic cones (CLC). The benchmarks are representative of these smaller CLCs.

Since his camouflaging technique makes it impossible for the attacker to discern the candidate gates, he or she needs to replace all gates in the design and encode them. Therefore, the length of the key to solve the camouflaging technique is always going to be longer than that of regular camouflaging, where the gates are known in advance. Since the key length K is longer, the overall search space for the solver also becomes larger, leading to higher attack run time. The results in Table 5 support this argument, as the SAT attack platform is unable to resolve most of the benchmark circuits in the allotted 12 hours. On the other hand, the SAT attack platform is able to resolve most of the circuits that have been camouflaged in a regular fashion (i.e., each camouflaged gate is either a NAND, NOR or XOR). These results show that as the attack is not successful even under a restricted notion (i.e., only four types of gates can be covert), it is not expected to scale under realistic scenarios where any gate could be a potential covert gate.

The benchmarks circuits are also evaluated using the disclosed approximate SAT or AppSAT attack algorithm. AppSAT experiment analysis, a timeout of 2 hours is set, as it should terminate early once it sees an improvement in error rate. The results show that AppSAT fares no better than regular SAT when used on covert gates. This is expected because AppSAT is only suitable for hybrid obfuscation schemes, where a low corruptibility obfuscation technique is combined with a high corruptibility technique. In the case of covert gates, AppSAT does not see a sufficient drop in the error rate to trigger early algorithm termination.

5.2 Test-Based Attack Results

For conducting the test-based attack, industrial-size sequential benchmark circuits with full-scan capabilities is considered (i.e., all the flip-flops are configured to form a scan chain, as mentioned in Section 2.1). It should be noted that, similar to SAT attacks, the success of test-based attacks will vary based on the information available to the adversary (See FIG. 18). In the experiments, variants of scenario 2 and 3 are followed, where only a few types of gate (and their respective pins) can be camouflaged. More specifically, different types of NOR gates present in the design (e.g., 3-input NOR gates NOR3X, 2-input NOR gates N OR2X) and assumed pin 1 of these gates could be dummy. For each suspect gate, the following steps are performed:

Force controlling value: Set a stuck-at-0 fault on the first pin of the current NOR gate n. This forces the ATPG tool to generate input patterns that sensitize the pin to logic 1 (the controlling value for a NOR gate).

Constrain other pins: Set a constraint of 0 on the first pin of all other N OR gates in the design. This forces the tool to only generate patterns that ensure 0 (non-controlling value) on these pins, since one or many of them could be dummies. This helps to avoid scenarios such as the ones shown in FIG. 17(c), where the effect of the dummy pin becomes unobservable due to another unidentified dummy pin. In order to not over-

TABLE 6

Results of test generation for detecting dummy inputs on various types of camouflaged gates.

| | | Gate Count | Detectable | | Undetectable | | ATPG Untestable | | Not Detected | |
|---|---|---|---|---|---|---|---|---|---|---|
| Benchmark | Gate | | # | % | # | % | # | % | # | % |
| b18 | NOR2X | 2390 | 10 | 0.42 | 5 | 0.21 | 2373 | 99.29 | 2 | 0.08 |
| Primitive Count = | NOR3X | 270 | 12 | 4.44 | 0 | 0.00 | 237 | 87.78 | 21 | 7.78 |
| 84,632 # Scan | NOR4X | 195 | 17 | 8.72 | 0 | 0.00 | 114 | 58.46 | 64 | 32.82 |
| DFF = 3020 | NAND2X | 4194 | 7 | 0.17 | 30 | 0.72 | 4154 | 99.05 | 3 | 0.07 |
| I/O = 40/24 | NAND3X | 2135 | 8 | 0.37 | 19 | 0.89 | 1849 | 86.60 | 259 | 12.13 |
| | NAND4X | 909 | 38 | 4.18 | 0 | 0.00 | 753 | 82.84 | 118 | 12.98 | constrain the pattern generation, the constraint is applied to only those NOR gates that fall in the fan-in or fan-out cone of NOR gate n.

Generate pattern: Run ATPG and generate pattern for resolving the pin on gate n.

Repeat: Repeat for all other pins.

For the NAND gates, the steps are the same as above, except that a stuck-at-1 fault instead of stuck-at-0 is set.

The results of the test generation procedure are shown in Table 6. In the table, 'Detectable' implies that the gate/pin in that location can be tested without any interference from other gates (i.e., it can be determined with certainty whether the pin on the gate is dummy or not). 'Undetectable' implies that a dummy pin placed on this location has no effect on the output i.e., it does not affect the circuit functionality. 'ATPG Untestable' implies that a test pattern cannot be generated to sensitize and propagate a controlling value on a potentially dummy pin (i.e., it cannot be determined whether the pin is dummy or not). Finally, 'Not Detected' implies that a test pattern to detect the pin could not be generated with the current ATPG tool effort level. Some of the observations from the table are as follows.

Even when considering that only one type of gate is covert in the netlist, the number of gates for which a test vector to differentiate between a dummy and a real pin is generated is very low. This is shown under the column 'Detected'. Note that from a designer's perspective, these are the locations to avoid inserting a covert gate.

From the table, certain locations in the netlist result in undetectable faults. Therefore, an attacker misidentifying a camouflaged gate at this location gains an advantage, as the recovered netlist's output is not corrupted due to this misidentification. However, note that the percentage of undetectable gates is never above 1%. Further, they can be avoided during the netlist integration process.

A large portion of the gates are either ATPG untestable or not detected, i.e., even under the very restricted notion of only one type of gate being camouflaged, it is not possible to generate a test pattern that differentiates the gate's pin as dummy or real. This is either because the pattern cannot be generated due to the added constraints (which are required to obtain guaranteed-correct patterns—thereby causing the gate to be ATPG untestable), or the ATPG tool is unable to generate a pattern with the current effort level set for the test generation algorithm (i.e., the gate is not detected). Further, when multiple types of gates are camouflaged with multiple pins, the success probability (i.e., chance of generating an input pattern to detect the dummy inputs) becomes even lower.

5.3 Netlist Integration Overhead

A set of experiments are performed with various benchmark circuits to estimate the overhead from integrating covert gates. All of the designs, obtained through the ITC'99 benchmark set 39 and opencores.org, were synthesized with an academic 90 nm standard cell library 32 in full-scan mode. For all the designs, 20% of inverters (INVX0)—selected randomly—to be converted to covert gates are allocated (with half as NOR2X2 and half as NAND2X2). The covert gate timing is emulated by setting a false timing path on the dummy pin, and power estimation is done by setting the dummy pin to a non-controlling value for the gate. Area, delay and power overhead estimates, as well as fan-out analysis to avoid combinational feedback loops were all performed in Synopsys Design Compiler. The results are shown in Table 7. From the results, the overhead from the covert gates is minimal with respect to the area, delay and power characteristics of the original design.

Note that in actual applications, inverter-to-NAND conversion are limited. Any n-input gate could be converted into a n+m input gate of the same type (where m>1). Further, the number of gates that are converted to covert gates could also be increased, based on the available overhead budget. However, when a large number of gates are converted to covert gates, delay and area overheads get worse. For example, when one or two extra pins are introduced to roughly half of all logic gates in the s38584 benchmark, delay overhead of 53.24% and area overhead of 19% were noticed.

5.4 Other Possible Attacks

In the VLSI test community, always-open and always-closed defects have been studied exhaustively. Although a test-based attack using stuck-at fault modeling, a natural question to ask would be if regular always-open/always-closed tests can be used to detect the camouflaged cells.

Table 7 below shows area, delay and power overhead estimates from integrating covert gates into benchmark circuits.

TABLE 7

| Benchmark | Area (μm²) | | | Delay (ns) | | | Power (μW) | | |
|---|---|---|---|---|---|---|---|---|---|
| | Covert | Original | % | Covert | Original | % | Covert | Original | % |
| aes | 114098.90 | 113384.22 | 0.63 | 18.19 | 15.99 | 13.76 | 2689.2 | 2678.9 | 0.38 |
| b12 | 9725.38 | 9646.59 | 0.81 | 2.98 | 2.88 | 3.47 | 154.9783 | 154.4319 | 0.35 |
| b15 | 53432.06 | 53134.15 | 0.56 | 26.32 | 26.32 | 0.00 | 654.9308 | 657.4276 | −0.38 |
| b17 | 171193.62 | 170264.84 | 0.54 | 32.47 | 31.14 | 4.27 | 2015.7 | 2011.3 | 0.22 |
| s35932 | 111402.38 | 111088.12 | 0.28 | 14.13 | 10.84 | 30.35 | 2290.2 | 2328.4 | −1.67 |
| s38417 | 107803.98 | 107349.70 | 0.42 | 20.84 | 16.69 | 24.87 | 1949 | 1949.6 | −0.03 |
| s38584 | 87647.35 | 87229.18 | 0.48 | 15.38 | 13.11 | 17.32 | 1572.1 | 1570.9 | 0.08 |

Always-closed defects are usually considered in the context of short-circuit current, i.e., if there is an always-closed transistor that causes a large current spike from VDD to GND, it can usually be detected by parametric tests under static conditions (i.e., no switching). However, the gates are constructed such that there is never a direct path from VDD to GND in any of the transistors in the covert gates. Therefore, it would not be possible to use leakage current measurements to detect the covert gates.

Always-open defects tend to behave as memory elements, as they cause floating nodes in the circuit. Therefore, a sequence of two input vectors could be used to first set the logic gate output to a known value, and then generate another vector to detect the fault. However, in the covert gates, an 'open defect' in the pull-up network is always compensated by a 'closed defect' in the pull-down network (and vice-versa). Thus, a regular two-pattern test to detect open defects is not applicable.

In summary, a covert gate-based camouflaging strategy that is rooted in the true meaning of camouflaging, i.e., creating gates that are truly indistinguishable from regular logic gates in a design. Transistor structures are disclosed to realize such gates and characterized their resistance to SEM imaging through experimental analysis. Models are created for the camouflaged logic gates and show that they achieve much lower overhead than those based on regular camouflaging techniques (e.g., dummy contacts). SAT and test-based attack evaluations were also performed on the camouflaging technique. In the absence of the attacker's ability to pin-point the covert gates, attack success greatly diminishes for both SAT and test-based attacks.

6. CONCLUSION

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A NOR circuit, comprising:
a regular PMOS transistor and an always-on PMOS transistor connected in series to form a pull-up network (PUN); and
a regular NMOS transistor and an always-off NMOS transistor connected in parallel to form a pull-down network (PDN), wherein the PUN and PDN are connected in series;
wherein the always-on PMOS transistor comprises:
an active region comprising first dopants at a first carrier concentration under a gate of the always-on PMOS transistor,
a source and a drain comprising second dopants, and
a layer of third dopants at a third carrier concentration arranged inside the active region, wherein the third carrier concentration of the third dopants is higher than the first carrier concentration of the first dopants, such that the always-on PMOS transistor remains in an always-on state; and
wherein the always-off NMOS transistor comprises:
an active region comprising the second dopants at a second carrier concentration under a gate of the always-off NMOS transistor,
a source and a drain comprising the first dopants,
a contact hole formed directly on a top of the gate of the always-off NMOS transistor, and
a layer of dielectric material coated on a side wall and a bottom of the contact hole to insulate said gate and said source from a conductive material filled into the contact hole, such that the always-off NMOS transistor remains in an always-off state.

2. The NOR circuit according to claim 1, wherein the third dopants are injected into the active region of the always-on PMOS transistor with ion implantation.

3. The NOR circuit according to claim 1, wherein the layer of dielectric material is silicon oxide or nitride.

4. A method of fabricating the NOR circuit according to claim 1, wherein the always-on PMOS transistor is formed by steps comprising:

forming the active region comprising the first dopants at the first carrier concentration under the gate of the always-on PMOS transistor;
forming the source and the drain comprising the second dopants; and
depositing the third dopants inside the active region of the always-on PMOS transistor, wherein the third dopants are deposited at a higher carrier concentration than the first carrier concentration of the first dopants, such that the always-on PMOS transistor remains in an always-on state, and wherein the first dopant and the third dopants have a same polarity.

5. A method of fabricating NOR circuit of claim 1, wherein the always-off NMOS transistor is formed by steps comprising:
forming the active region comprising the second dopants under the gate of the always-off NMOS transistor;
forming the source and the drain comprising the first dopants;
forming the contact hole directly on a top of said gate; and
depositing a layer of dielectric material on the side wall and the bottom of the contact hole to insulate said gate from the conductive material filled into the contact hole, such that the always-off NMOS transistor remains in an always-off state.

6. A NAND circuit, comprising:
a regular PMOS transistor and an always-off PMOS transistor connected in parallel to form a PULL-UP network (PUN); and
a regular NMOS transistor and an always-on NMOS transistor connected in series to form a pull-down network (PDN), wherein the PUN and PDN are connected in series;
wherein the always-off PMOS transistor comprises:
an active region comprising the first dopants under a gate of the always-off PMOS transistor,
a source and a drain comprising a second dopants,
a contact hole formed directly on a top of the gate of the always-off PMOS transistor, and
a layer of dielectric material coated on a side wall and a bottom of the contact hole to insulate said gate and said source from a conductive material filled into the contact hole, such that the always-off PMOS transistor remains in an always-off state; and
wherein the always-on NMOS transistor comprises:
an active region comprising the second dopants at a second carrier concentration under a gate of the always-on NMOS transistor,
a source and a drain comprising the first dopants, and
a layer of third dopants at a third carrier concentration arranged inside the active region, wherein the third carrier concentration of the third dopants is higher than the second carrier concentration of the second dopants, such that the always-on NMOS transistor remains in an always-on state.

7. The NAND circuit according to claim 6, wherein the third dopants are injected into the active region of the always-on NMOS transistor with ion implantation.

8. The NAND circuit according to claim 6, wherein the layer of dielectric material is silicon oxide or nitride.

9. A method of fabricating the NAND circuit according to claim 6, wherein the always-on NMOS transistor is formed by steps comprising:
forming the active region comprising the second dopants at the second carrier concentration under the gate of the always-on NMOS transistor;

forming the source and the drain comprising the first dopants; and depositing the third dopants inside the active region of the always-on NMOS transistor, wherein the third dopants are deposited at a higher carrier concentration than the first carrier concentration of the first dopants, such that the always-on NMOS transistor remains in an always-on state, and wherein the second dopants and the third dopants have a same polarity.

10. A method of fabricating the NAND circuit according to claim 6, wherein the always-off PMOS transistor is formed by steps comprising:

forming the active region comprising the first dopants under the gate of the always-off PMOS transistor;

forming the source and the drain comprising the second dopants;

forming the contact hole directly on a top of said gate; and depositing a layer of dielectric material on the side wall and the bottom of the contact hole to insulate said gate from the conductive material filled into the contact hole, such that the always-off PMOS transistor remains in an always-off state.

\* \* \* \* \*